United States Patent
Lee et al.

(10) Patent No.: US 11,421,314 B2
(45) Date of Patent: Aug. 23, 2022

(54) MASK ASSEMBLY, AND APPARATUS AND METHOD FOR MANUFACTURING DISPLAY APPARATUS USING MASK ASSEMBLY

(71) Applicant: SAMSUNG DISPLAY CO., LTD., Yongin-si (KR)

(72) Inventors: Yoonseo Lee, Yongin-si (KR); Jiyun Chun, Yongin-si (KR); Jongsung Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/512,047

(22) Filed: Jul. 15, 2019

(65) Prior Publication Data

US 2020/0102636 A1  Apr. 2, 2020

(30) Foreign Application Priority Data

Sep. 28, 2018  (KR) .................. 10-2018-0116584

(51) Int. Cl.
*H01L 51/00* (2006.01)
*C23C 14/04* (2006.01)
*C23C 16/04* (2006.01)

(52) U.S. Cl.
CPC .......... *C23C 14/042* (2013.01); *C23C 16/042* (2013.01); *H01L 51/0011* (2013.01)

(58) Field of Classification Search
CPC ... H01L 51/0011; H01L 51/56; C23C 14/042; C23C 16/042; G03F 7/16
See application file for complete search history.

(56) References Cited

U.S. PATENT DOCUMENTS

| | | | |
|---|---|---|---|
| 9,997,708 B2 | 6/2018 | Kim et al. | |
| 10,787,731 B2 * | 9/2020 | Xie | C23C 14/24 |
| 2012/0279444 A1 | 11/2012 | Hong | |
| 2016/0343994 A1 * | 11/2016 | Wu | H01L 51/56 |
| 2017/0133592 A1 * | 5/2017 | Baek | H01L 51/0011 |
| 2017/0207390 A1 * | 7/2017 | Kim | C23C 14/24 |
| 2017/0365822 A1 * | 12/2017 | Kim | H01L 51/56 |
| 2020/0238328 A1 * | 7/2020 | Lee | B05C 21/005 |

FOREIGN PATENT DOCUMENTS

| | | |
|---|---|---|
| CN | 107699854 A | 2/2018 |
| KR | 10-2017-0086160 A | 7/2017 |
| KR | 10-2017-0141854 A | 12/2017 |
| KR | 10-1837624 B1 | 3/2018 |

* cited by examiner

*Primary Examiner* — Deoram Persaud
(74) *Attorney, Agent, or Firm* — Lewis Roca Rothgerber Christie LLP

(57) ABSTRACT

A mask assembly, and an apparatus and method for manufacturing a display apparatus by using the mask assembly are provided. A mask assembly includes: a mask frame; a mask sheet on the mask frame and including a plurality of openings; at least two first shielding sheets on the mask frame and shielding some of the plurality of openings of the mask sheet; and at least two second shielding sheets on the mask frame and shielding some of the plurality of openings of the mask sheet, the at least two first shielding sheets and the at least two second shielding sheets define a deposition area including some of the plurality of openings of the mask sheet by shielding some of the plurality of openings of the mask sheet, and the deposition area is divided into a first deposition area and a second deposition area.

40 Claims, 14 Drawing Sheets

MASK ASSEMBLY, AND APPARATUS AND METHOD FOR MANUFACTURING DISPLAY APPARATUS USING MASK ASSEMBLY

CROSS-REFERENCE TO RELATED APPLICATION

This application claims priority to and the benefit of Korean Patent Application No. 10-2018-0116584, filed on Sep. 28, 2018 in the Korean Intellectual Property Office, the entire disclosure of which is incorporated herein by reference.

BACKGROUND

1. Field

Aspects of one or more embodiments relate to an apparatus and a method and, more particularly, to a mask assembly, and an apparatus and method for manufacturing a display apparatus using the mask assembly.

2. Description of the Related Art

Mobile electronic devices have been widely used. Tablet personal computers (PCs), as well as small electronic devices, such as mobile phones, have recently been widely used as mobile electronic devices.

Mobile electronic devices include display apparatuses for providing visual information such as images to users to support various functions. Recently, as other components for driving display apparatuses have been miniaturized, percentages of the display apparatuses in mobile electronic devices have gradually increased and structures have been developed to be bendable by predetermined angles from flat states.

Display apparatuses may include display areas where images are displayed. The display areas may be formed to have various shapes in order to manufacture various electronic devices. That is, the display areas may be formed to have irregular shapes, instead of rectangular shapes.

Mask assemblies used to form display areas having irregular shapes may be thermally deformed or distorted by a tensile force, such that an existing mask assembly may be changed to have values different from design values due to thermal deformation or a tensile force applied.

SUMMARY

According to an aspect of one or more embodiments, a mask assembly minimizes or reduces deformation, and an apparatus and method for manufacturing a display apparatus, and a display apparatus are provided.

Additional aspects will be set forth, in part, in the description which follows and, in part, will be apparent from the description, or may be learned by practice of the presented embodiments According to one or more embodiments, a mask assembly includes: a mask frame; a mask sheet on the mask frame and including a plurality of openings; at least two first shielding sheets on the mask frame and shielding some of the plurality of openings of the mask sheet, the at least two first shielding sheets being spaced apart from one another; and at least two second shielding sheets on the mask frame and shielding some of the plurality of openings of the mask sheet, the at least two second shielding sheets each formed to have an angle (e.g., a predetermined angle) with respect to each of the at least two first shielding sheets, the at least two second shielding sheets being spaced apart from one another, wherein the at least two first shielding sheets and the at least two second shielding sheets define a deposition area including some of the plurality of openings of the mask sheet by shielding some of the plurality of openings of the mask sheet, wherein the deposition area is divided into a first deposition area and a second deposition area by an arbitrary straight line passing through the center of a space formed by two adjacent first shielding sheets of the at least two first shielding sheets and parallel to a longitudinal direction of a first shielding sheet of the at least two first shielding sheets, and shapes of the first deposition area and the second deposition area are different from each other.

The first shielding sheet may include: a first shielding sheet body portion; and a first protrusion protruding from the first shielding sheet body portion to have an angle (e.g., a predetermined angle) in a longitudinal direction of the first shielding sheet body portion.

The first protrusion may include a plurality of first protrusions, wherein two first protrusions from among the plurality of first protrusions face each other about the first shielding sheet body portion.

The two first protrusions facing each other about the first shielding sheet body portion may have a same shape.

Portions of at least one of the first shielding sheet and the second shielding sheet may be symmetric about a virtual central line parallel to the longitudinal direction.

The first shielding sheet and the second shielding sheet may be perpendicular to each other.

The second shielding sheet may include: a second shielding sheet body portion; and a second protrusion protruding from the second shielding sheet body portion.

The second protrusion may include a plurality of second protrusions, wherein two second protrusions from among the plurality of second protrusions face each other about the second shielding sheet body portion.

The first shielding sheet may include: a first shielding sheet body portion; and a first protrusion protruding from the first shielding sheet body portion to have an angle (e.g., a predetermined angle) in a longitudinal direction of the first shielding sheet body portion.

At least portions of the first protrusion and the second protrusion may overlap with each other.

The first protrusion and the second protrusion may have different shapes.

The first protrusion and the second protrusion may have different areas.

According to one or more embodiments, an apparatus for manufacturing a display apparatus includes: a deposition source; a mask assembly facing the deposition source to allow a deposition material ejected from the deposition source to pass therethrough; and a substrate support portion facing the mask assembly and supporting a substrate on which the deposition material passing through the mask assembly is deposited, wherein the mask assembly includes: a mask frame; a mask sheet on the mask frame and including a plurality of openings; at least two first shielding sheets on the mask frame and shielding some of the plurality of openings of the mask sheet, the at least two first shielding sheets being spaced apart from one another; and at least two second shielding sheets on the mask frame and shielding some of the plurality of openings of the mask sheet, the at least two second shielding sheets each formed to have an angle (e.g., a predetermined angle) with respect to each of the at least two first shielding sheets, the at least two second shielding sheets spaced apart from one another, wherein the at least two first shielding sheets and the at least two second shielding sheets define a deposition area including some of the plurality of openings of the mask sheet by shielding some of the plurality of openings of the mask sheet, wherein the deposition area is divided into a first deposition area and a second deposition area by an arbitrary straight line passing through the center of a space formed by two adjacent first shielding sheets of the at least two first shielding sheets and parallel to a longitudinal direction of a first shielding sheet of the at least two first shielding sheets, and shapes of the first deposition area and the second deposition area are different from each other.

The first shielding sheet may include: a first shielding sheet body portion; and a first protrusion protruding from the first shielding sheet body portion to have an angle (e.g., a predetermined angle) in a longitudinal direction of the first shielding sheet body portion.

The first protrusion may include a plurality of first protrusions, wherein two first protrusions from among the plurality of first protrusions face each other about the first shielding sheet body portion.

The two first protrusions facing each other about the first shielding sheet body portion may have a same shape.

Portions of at least one of the first shielding sheet and the second shielding sheet may be symmetric about a virtual central line parallel to the longitudinal direction.

The first shielding sheet and the second shielding sheet may be perpendicular to each other.

The second shielding sheet may include: a second shielding sheet body portion; and a second protrusion protruding from the second shielding sheet body portion.

The second protrusion may include a plurality of second protrusions, wherein two second protrusions from among the plurality of second protrusions face each other about the second shielding sheet body portion.

The first shielding sheet may include: a first shielding sheet body portion; and a first protrusion protruding from the first shielding sheet body portion to have an angle (e.g., a predetermined angle) in a longitudinal direction of the first shielding sheet body portion.

At least portions of the first protrusion and the second protrusion may overlap with each other.

The first protrusion and the second protrusion may have different shapes.

The first protrusion and the second protrusion may have different areas.

According to one or more embodiments, a method of manufacturing a display apparatus includes: arranging a display substrate and a mask assembly in a chamber; aligning the display substrate with the mask assembly; and forming a deposition material pattern on the display substrate by supplying a deposition material from a deposition source facing the mask assembly, wherein the mask assembly includes: a mask frame; a mask sheet on the mask frame and including a plurality of openings; at least two first shielding sheets on the mask frame and shielding some of the plurality of openings of the mask sheet, the at least two first shielding sheets being spaced apart from one another; and at least two second shielding sheets on the mask frame and shielding some of the plurality of openings of the mask sheet, the at least two second shielding sheets each formed to have an angle (e.g., a predetermined angle) with respect to each of the at least two first shielding sheets, the at least two second shielding sheets being spaced apart from one another, wherein the at least two first shielding sheets and the at least two second shielding sheets define a deposition area including some of the plurality of openings of the mask sheet by shielding some of the plurality of openings of the mask sheet, wherein the deposition area is divided into a first deposition area and a second deposition area by an arbitrary straight line passing through the center of a space formed by two adjacent first shielding sheets of the at least two first shielding sheets and parallel to a longitudinal direction of a first shielding sheet of the at least two first shielding sheets, and shapes of the first deposition area and the second deposition area are different from each other.

The first shielding sheet may include: a first shielding sheet body portion; and a first protrusion protruding from the first shielding sheet body portion to have an angle (e.g., a predetermined angle) in a longitudinal direction of the first shielding sheet body portion.

The first protrusion may include a plurality of first protrusions, wherein two first protrusions from among the plurality of first protrusions face each other about the first shielding sheet body portion.

The two first protrusions facing each other about the first shielding sheet body portion may have a same shape.

Portions of at least one of the first shielding sheet and the second shielding sheet may be symmetric about a virtual central line parallel to the longitudinal direction.

The first shielding sheet and the second shielding sheet may be perpendicular to each other.

The second shielding sheet may include: a second shielding sheet body portion; and a second protrusion protruding from the second shielding sheet body portion.

The second protrusion may include a plurality of second protrusions, wherein two second protrusions from among the plurality of second protrusions face each other about the second shielding sheet body portion.

The first shielding sheet may include: a first shielding sheet body portion; and a first protrusion protruding from the first shielding sheet body portion to have an angle (e.g. a predetermined angle) in a longitudinal direction of the first shielding sheet body portion.

At least portions of the first protrusion and the second protrusion may overlap with each other.

The first protrusion and the second protrusion may have different shapes.

The first protrusion and the second protrusion may have different areas.

According to one or more embodiments, a method of manufacturing a display apparatus includes: arranging a display substrate and a mask assembly in a chamber; aligning the display substrate with the mask assembly; and forming a deposition material pattern on the display substrate by supplying a deposition material from a deposition source facing the mask assembly, wherein the deposition material pattern formed on the display substrate is used to form a display area, the display area is divided into two areas by an arbitrary straight line passing through the center of the display area, and the two areas of the display area are asymmetric to each other.

The mask assembly may define a deposition area through which the deposition material passes to be deposited on the display substrate, such that the deposition area corresponds to the display area.

The mask assembly may include: a mask sheet on a mask frame and including a plurality of openings; at least two first shielding sheets on the mask frame and shielding some of the plurality of openings of the mask sheet, the at least two first shielding sheets being spaced apart from one another; and at least two second shielding sheets on the mask frame and shielding some of the plurality of openings of the mask sheet, the at least two second shielding sheets having an angle (e.g., a predetermined angle) with respect to each of the at least two first shielding sheets, the at least two second shielding sheets being spaced apart from one another, wherein the at least two first shielding sheets and the at least two second shielding sheets define the deposition area.

According to one or more embodiments, a method of manufacturing a display apparatus includes: arranging a display substrate and a mask assembly in a chamber; aligning the display substrate with the mask assembly; and forming a deposition material pattern on the display substrate by supplying a deposition material from a deposition source facing the mask assembly, wherein the deposition material pattern formed on the display substrate is used to form a display area, and the display area includes a first display area formed when a part of the deposition material is shielded by a protrusion of a first shielding sheet of the mask assembly protruding into a deposition area defined by the mask assembly, and a second display area formed when a part of the deposition material is shielded by a protrusion of a second shielding sheet of the mask assembly protruding into the deposition area defined by the mask assembly.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Figure 1:
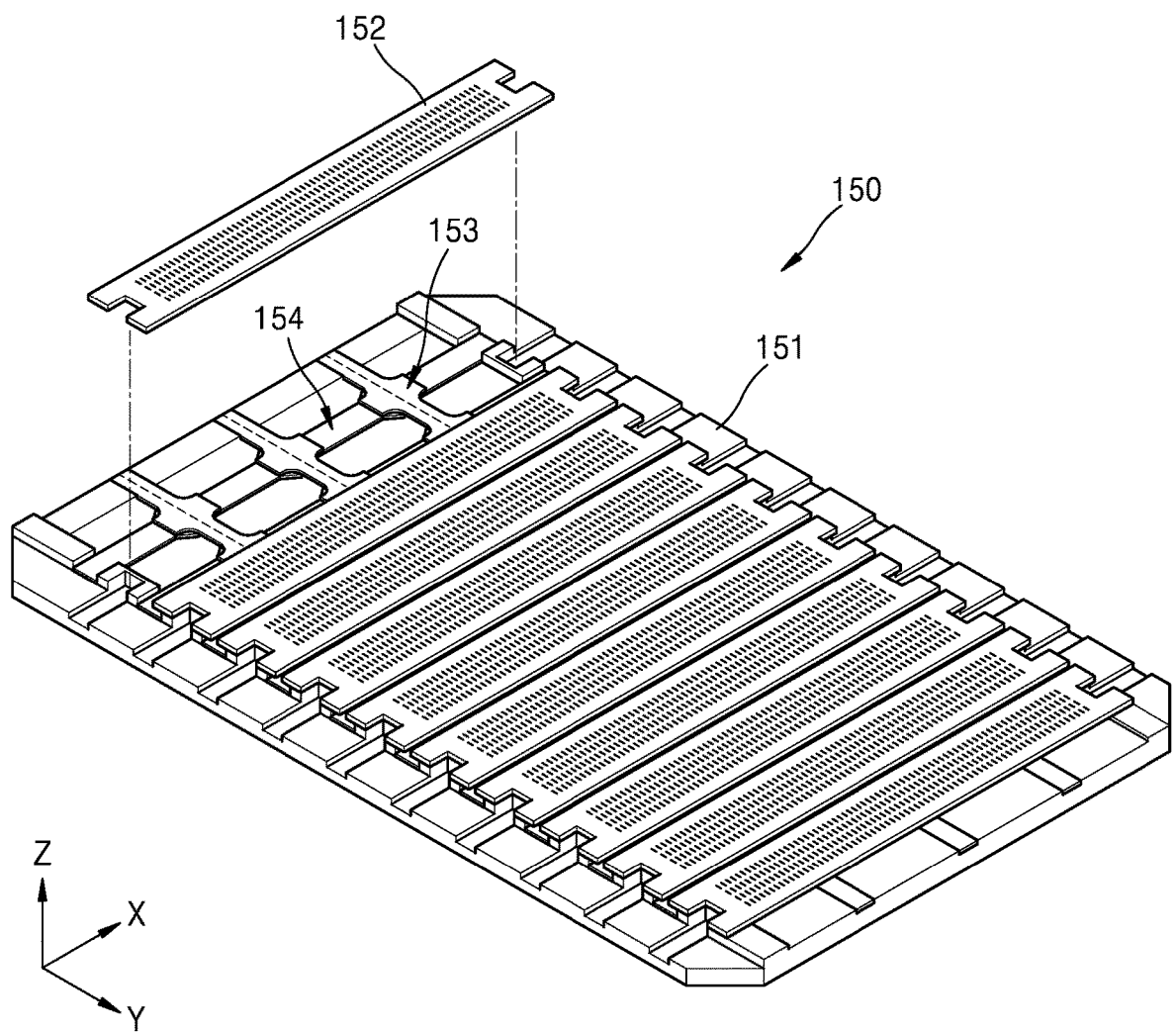
FIG. 1 is a perspective view of a mask assembly according to an embodiment.

The present disclosure may include various embodiments and modifications, and some embodiments thereof will be illustrated in the drawings and will be described herein in further detail. The effects and features of the present disclosure and the accompanying methods thereof will become apparent from the following description of the embodiments, taken in conjunction with the accompanying drawings. However, the present disclosure is not limited to the embodiments described below, and may be embodied in various modes.

Reference will now be made in further detail to some embodiments, examples of which are illustrated in the accompanying drawings. In the drawings, the same elements are denoted by the same reference numerals, and a repeated explanation thereof will not be given.

It is to be understood that although the terms "first," "second," etc. may be used herein to describe various elements, these elements should not be limited by these terms. These elements are used to distinguish one element from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, region, or element is referred to as being "formed on" another layer, region, or element, it may be directly or indirectly formed on the other layer, region, or element. That is, for example, one or more intervening layers, regions, or elements may be present.

Sizes of elements may be exaggerated for convenience of explanation. In other words, since sizes and thicknesses of elements in the drawings may be arbitrarily illustrated for convenience of explanation, the following embodiments are not limited thereto.

When a certain embodiment may be implemented differently, a specific process order may be different from the described order. For example, two consecutively described processes may be performed substantially at the same time or performed in an order opposite to the described order.

It is to be understood that when a layer, region, or element is referred to as being "connected," the layer, the region, or the element may be directly connected or may be indirectly connected with one or more intervening layers, regions, or elements therebetween. For example, when a layer, region, or element is electrically connected, the layer, region, or element may be directly electrically connected or may be indirectly electrically connected with one or more intervening layers, regions, or elements therebetween.

As used herein, the term "and/or" includes any and all combinations of one or more of the associated listed items. Expressions such as "at least one of", when preceding a list of elements, modify the entire list of elements and do not modify the individual elements of the list.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a mask assembly 150 according to an embodiment.

Figure 2:
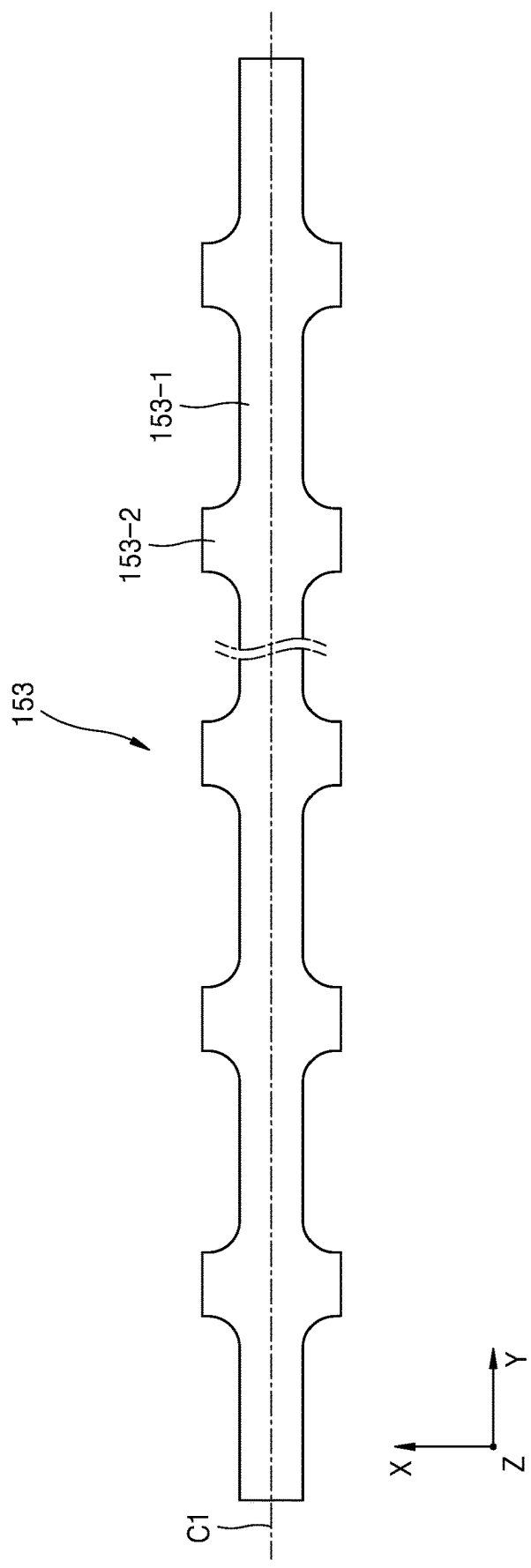
FIG. 2 is a plan view illustrating a first shielding sheet of FIG. 1.
Figure 3:
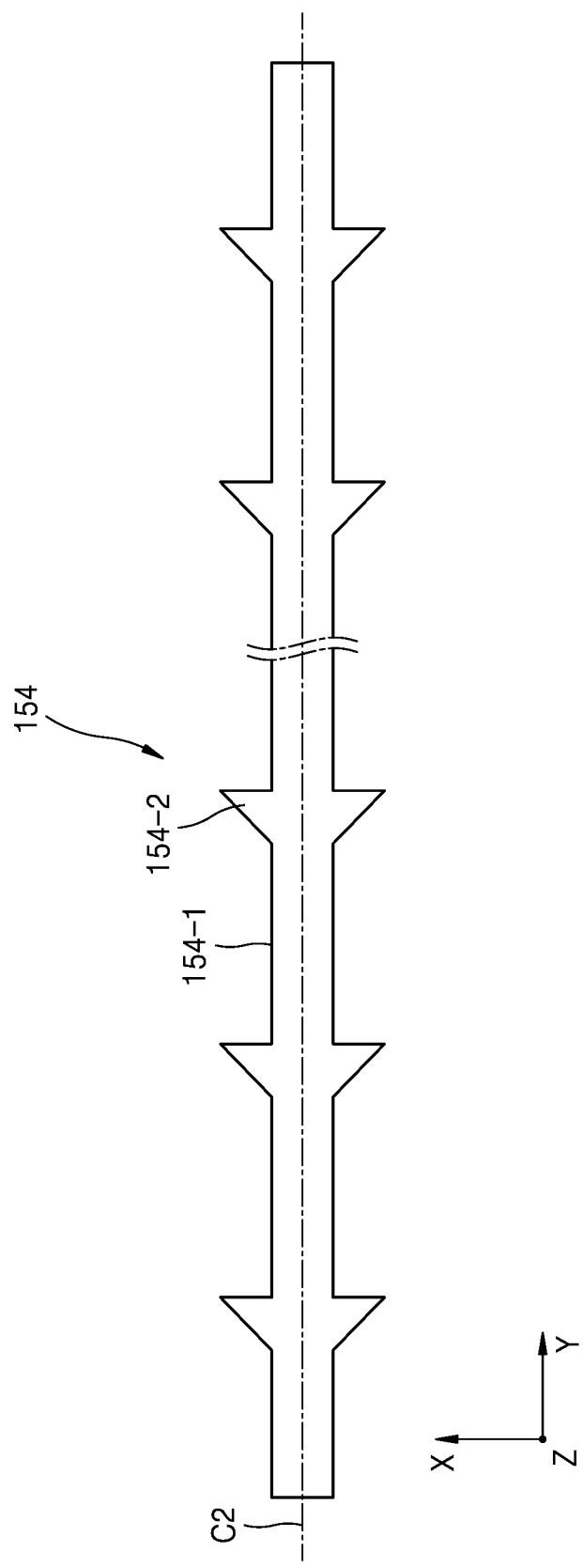
FIG. 3 is a plan view illustrating a second shielding sheet of FIG. 1.
Figure 4A:
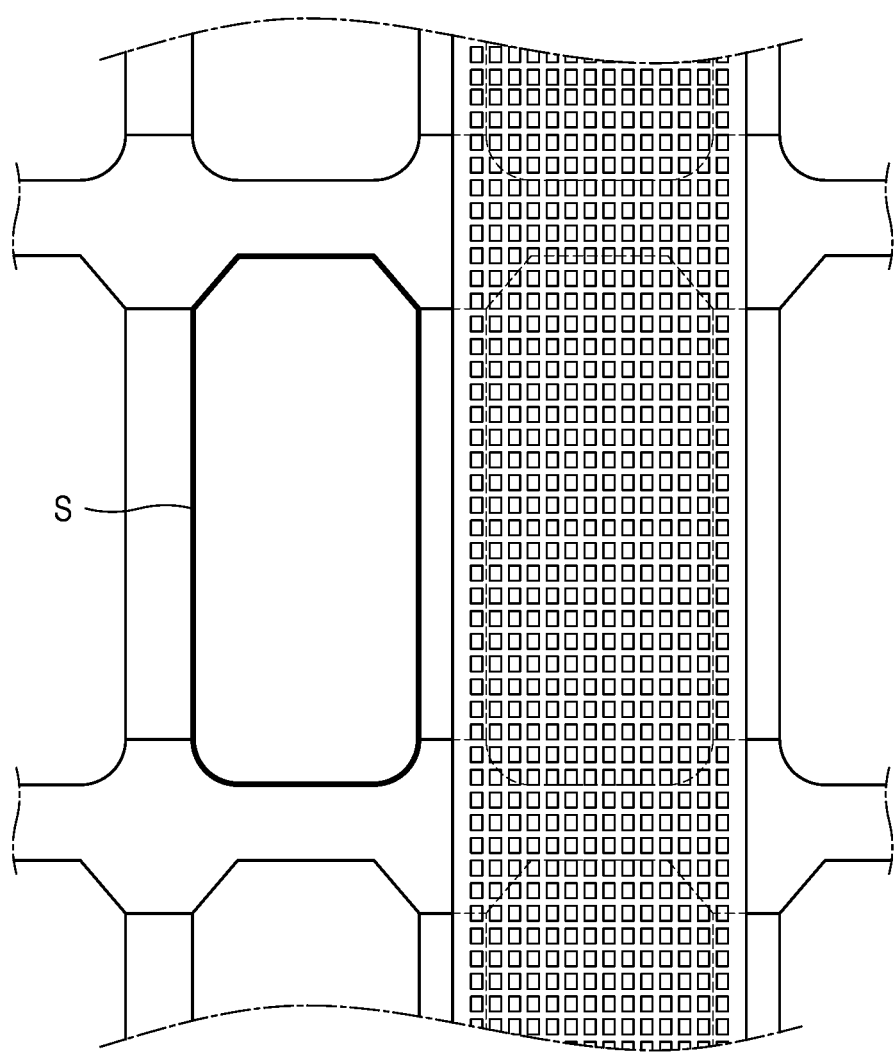
FIG. 4A is a plan view illustrating a deposition area of a general mask assembly.
Figure 4B:
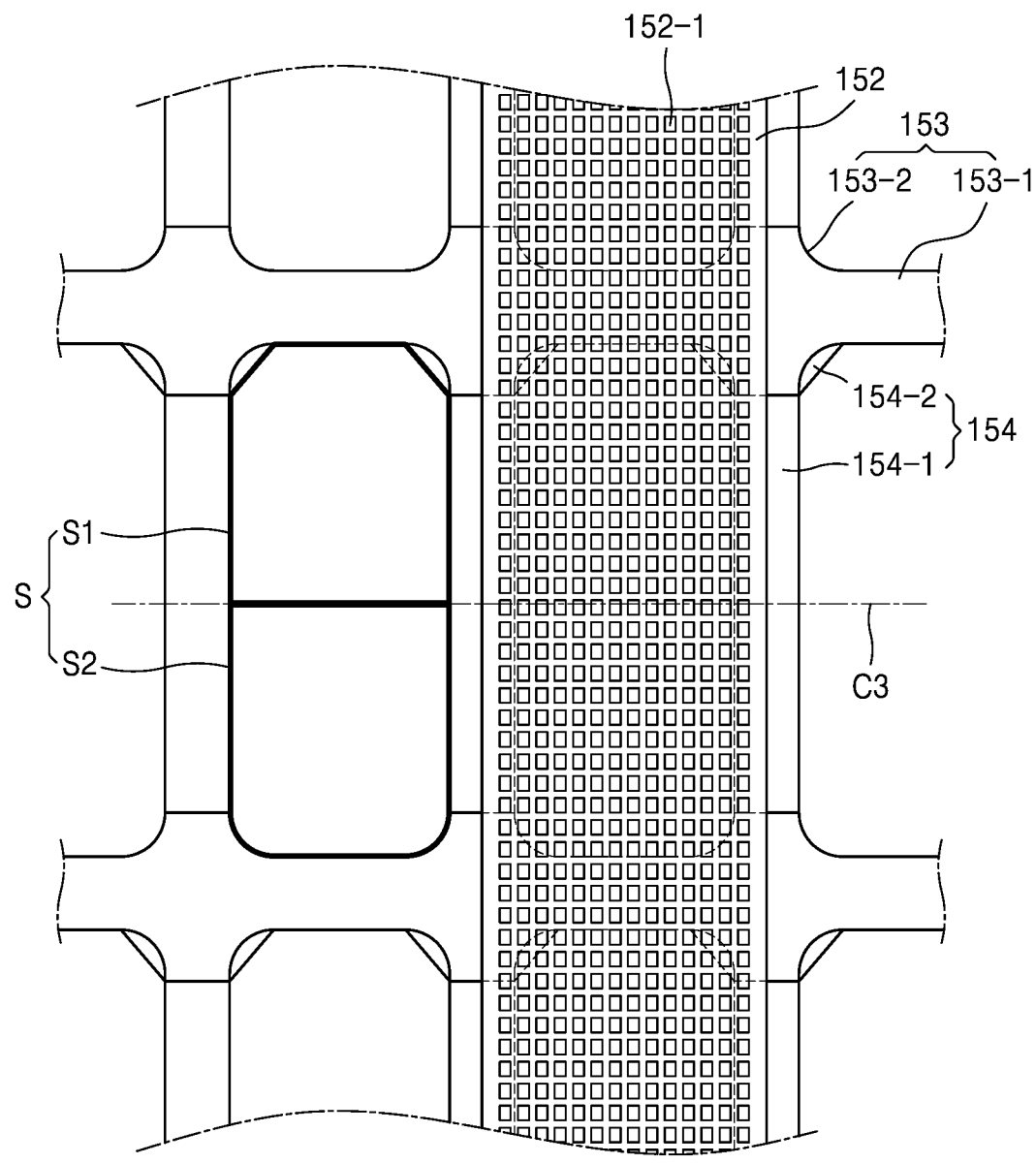
FIG. 4B is a plan view illustrating a deposition area of the mask assembly of FIG. 1.

FIG. 2 is a plan view illustrating a first shielding sheet of FIG. 1; FIG. 3 is a plan view illustrating a second shielding sheet of FIG. 1; FIG. 4A is a plan view illustrating a deposition area of a general mask assembly; and FIG. 4B is a plan view illustrating a deposition area of the mask assembly 150 of FIG. 1.

Referring to FIGS. 1 through 4B, the mask assembly 150 may include a mask frame 151, a mask sheet 152, a first shielding sheet 153, and a second shielding sheet 154.

In an embodiment, the mask assembly 150 may be formed such that frames of a plurality of frames are connected to one another to form an inner space. In an embodiment, the mask assembly 150 may have a frame shape having one opening at the center thereof. In another embodiment, the mask assembly 150 may have a lattice shape, such as a window frame having a plurality of openings. For convenience of explanation, the following will be described in further detail on the assumption that one opening is formed at the center of the mask assembly 150.

At least two mask sheets 152 may be provided, and may be provided on the mask frame 151 to be spaced apart from each other. In this case, the mask sheets 152 may be arranged in a first direction (e.g., a Y-direction or an X-direction of FIG. 1). For convenience of explanation, the following will be described in further detail on the assumption that the first direction is the X-direction of FIG. 1.

Each of the mask sheets 152 may include at least one opening 152-1. In particular, a plurality of openings 152-1 may be formed in a longitudinal direction in the mask sheet 152. In an embodiment, the plurality of openings 152-1 may be spaced apart from one another by an interval (e.g., a predetermined interval) and may be formed in an entire surface of the mask sheet 152.

The first shielding sheet 153 may be located between the mask frame 151 and the mask sheet 152. In an embodiment, a plurality of the first shielding sheets 153 may be provided and may be located on the mask frame 151 to be spaced apart from one another. For example, the plurality of first shielding sheets 153 may be spaced apart from one another in the longitudinal direction of the mask sheet 152. Also, the first shielding sheet 153 may be formed to have an angle (e.g., a predetermined angle) with respect to the mask sheet 152. For example, the first shielding sheets 153 may be arranged in a direction (e.g., the X-direction or the Y-direction of FIG. 1) perpendicular to the longitudinal direction of the mask sheet 152. For convenience of explanation, the following will be described in further detail on the assumption that the first shielding sheets 153 are arranged in the Y-direction of FIG. 1.

In an embodiment, the first shielding sheet 153 may be symmetric about a first central line C1 parallel to a longitudinal direction of the first shielding sheet 153 and passing through the center of the first shielding sheet 153. The first shielding sheet 153 may include a first shielding sheet body portion 153-1 provided on the mask frame 151, and a first protrusion 153-2 protruding from the first shielding sheet body portion 153-1.

The first shielding sheet body portion 153-1 may have a straight plate shape. In this case, the first shielding sheet body portion 153-1 may be arranged in a direction (or a second direction, the Y-direction of FIG. 1) perpendicular to the longitudinal direction of the mask sheet 152.

The first protrusion 153-2 may protrude from the first shielding sheet body portion 153-1 in the longitudinal direction of the mask sheet 152. In this case, the first protrusion 153-2 may define a boundary of a deposition area S along with the first shielding sheet body portion 153-1. In this case, the first protrusion 153-2 may define the boundary of the deposition area S in any of various shapes. In particular, the first protrusion 153-2 may define an inclined portion or a curved portion having an angle (e.g., a predetermined angle) with respect to the first shielding sheet body portion 153-1 in the boundary of the deposition area S. In this case, the first protrusion 153-2 may shield some of the plurality of openings 152-1 of the mask sheet 152. For example, the first protrusion 153-2 may shield some of the openings 152-1 arranged at the boundary (or an edge) of the deposition area S. In this case, a deposition material may pass through only some of the openings 152-1.

In an embodiment, the first protrusions 153-2 may protrude from both sides of the first shielding sheet body portion 153-1 to have an angle (e.g., a predetermined angle) in the longitudinal direction of the first shielding sheet body portion 153-1. In an embodiment, two first protrusions 153-2 may be provided at both sides of the first shielding sheet body portion 153-1 about the first shielding sheet body portion 153-1. In this case, the two first protrusions 153-2 located at both sides of the first shielding sheet body portion 153-1 may have a same shape and a same size. In an embodiment, a plurality of the first protrusions 153-2 may be provided. In this case, the plurality of first protrusions 153-2 may be divided into a plurality of groups, each including two first protrusions 153-2, and the first protrusions 153-2 of each group may be spaced apart from each other in the longitudinal direction of the first shielding sheet body portion 153-1. In this case, both portions of the first shielding sheets 153 may be symmetric about the first central line C1.

The second shielding sheet 154 may be located to have an angle (e.g., a predetermined angle) with respect to the first shielding sheet 153. In an embodiment, the second shielding sheets 154 may be arranged to be perpendicular to the first shielding sheets 153. The second shielding sheet 154 may define the deposition area S along with the first shielding sheet 153. In this case, the second shielding sheet 154 may be located between the mask frame 151 and the mask sheet 152. In an embodiment, a plurality of the second shielding sheets 154 may be provided, and the plurality of second shielding sheets 154 may be spaced apart from one another in the longitudinal direction of the first shielding sheet 153.

In an embodiment, the second shielding sheet 154 may be symmetric about a second central line C2 parallel to a longitudinal direction of the second shielding sheet 154 and passing through the center of the second shielding sheet 154. The second shielding sheet 154 may include a second shielding sheet body portion 154-1 and a second protrusion 154-2.

The second shielding sheet body portion 154-1 may have a straight plate shape. In this case, the second shielding sheet body portion 154-1 may be located in the longitudinal direction of the mask sheet 152.

The second protrusion 154-2 may protrude from the second shielding sheet body portion 154-1 in the longitudinal direction of the first shielding sheet body portion 153-1. The second protrusion 154-2 may define the boundary (or the edge) of the deposition area S along with the second shielding sheet body portion 154-1. In this case, the second protrusion 154-2 may define the boundary of the deposition area S in any of various shapes. For example, the second protrusion 154-2 may define an inclined portion or a curved portion having an angle (e.g., a predetermined angle) with respect to the second shielding sheet body portion 154-1 in the boundary of the deposition area S. In this case, the second protrusion 154-2 may shield some of the plurality of openings 152-1, like the first protrusion 153-2.

The second protrusion 154-2 may be different from the first protrusion 153-2. For example, a shape of the second protrusion 154-2 may be different from that of the first protrusion 153-2. In another embodiment, the first protrusion 153-2 and the second protrusion 154-2 may have the same shape and different areas (or sizes). In this case, the first protrusion 153-2 and the second protrusion 154-2 may be formed to at least partially overlap each other. In another embodiment, only some of the plurality of first protrusions 153-2 may overlap the second protrusion 154-2.

The second protrusion 154-2 may protrude from the second shielding sheet body portion 154-1 to have an angle (e.g., a predetermined angle) with respect to the longitudinal direction of the second shielding sheet body portion 154-1. In an embodiment, a plurality of the second protrusions 154-2 may be provided. In this case, the plurality of second protrusions 154-2 may be divided into groups each including two second protrusions 154-2, and the plurality of groups may be spaced apart from one another in the longitudinal direction of the second shielding sheet body portion 154-1. Also, two second protrusions 154-2 of each group may face each other about the second shielding sheet body portion 154-1. In this case, the facing second protrusions 154-2 may have a same shape and a same size. In this case, both portions of the second shielding sheet 154 may be symmetric about the second central line C2.

The plurality of first shielding sheets 153 and the plurality of second shielding sheets 154 may define at least one deposition area S. In this case, one deposition area S may refer to an area where a deposition material passes through the plurality of openings 152-1 located in a space formed by two adjacent first shielding sheets 153 and two adjacent second shielding sheets 154. The deposition area S may have an irregular shape excluding a rectangular shape or a square shape. For example, the deposition area S may have a triangular shape, a polygonal shape, an elliptical shape, or a circular shape. In this case, the irregular shape of the deposition area S may refer to a case in which a first deposition area S1 and a second deposition area S2 located at both sides of a third central line C3 about the third central line C3 have different shapes.

The deposition area S may be divided into the first deposition area S1 and the second deposition area S2 about the third central line C3 parallel to the first shielding sheet 153 and passing through the center of the deposition area S. In this case, the first deposition area S1 and the second deposition area S2 may have different shapes. That is, the first deposition area S1 and the second deposition area S2 may be asymmetric to each other about the third central line C3. In an embodiment, an edge portion of the first deposition area S1 may be round. In contrast, an edge portion of the second deposition area S2 may be inclined.

In an embodiment, the first shielding sheet 153, the second shielding sheet 154, and the mask sheet 152 may be formed of different materials. For example, the first shielding sheet 153 and the second shielding sheet 154 may include austenitic stainless steel, and the mask sheet 152 may include a nickel-iron alloy (e.g., Invar).

In a method of manufacturing the mask assembly 150 according to an embodiment, the first shielding sheet 153 and the second shielding sheet 154 may be located on the mask frame 151, and then may be fixed to the mask frame 151.

In further detail, after the second shielding sheet 154 is located on the mask frame 151, the second shielding sheet 154 may be stretched. In this case, since both portions of the second shielding sheet 154 are symmetric to each other about the second central line C2, distortion or partial deformation may be prevented even when a tensile force is applied. Also, when a deposition material passes through the second shielding sheet 154, since deformation of the second shielding sheet 154 caused by the deposition material that is at a high temperature uniformly occurs to some extent over the second shielding sheet 154, and both portions of the second shielding sheet 154 about the second central line C2 may be equally deformed due to a symmetric shape of the second shielding sheet 154, distortion or excessive partial deformation of the second shielding sheet 154 may be prevented or substantially prevented.

Both ends of the second shielding sheet 154 may be fixed to the mask frame 151 while being inserted into the mask frame 151.

The first shielding sheet 153 may be located on the mask frame 151 and then may be fixed to the mask frame 151, like the second shielding sheet 154. In this case, a tensile force may also be applied to the first shielding sheet 153. In this case, since both portions of the first shielding sheet 153 are symmetric to each other about the first central line C1, the entire first shielding sheet 153 may be almost equally deformed when the first shielding sheet 153 is stretched.

In general, when a deposition area having an irregular shape is formed by using only a first shielding sheet, shapes of first protrusions located at both sides of a first shielding sheet body portion have to be different from each other. In this case, when the first shielding sheet is stretched or when the first shielding sheet is heated by a high-temperature deposition material, change rates in portions of the first shielding sheet are different from one another due to an asymmetric shape of the first shielding sheet, thereby forming the deposition area having values different from design values. Accordingly, since an emission area having a shape different from a design shape is formed on a display substrate, defects may occur and quality may be reduced.

However, in the present embodiment, since the first shielding sheet 153 and the second shielding sheet 154 are formed such that both portions of each of the first shielding sheet 153 and the second shielding sheet 154 are symmetric about a central line parallel to a longitudinal direction as described above, deformation during stretching or deposition of a deposition material may be minimized or reduced. Also, since the second protrusion 154-2 of the second shielding sheet 154 overlaps the first protrusion 153-2 of the first shielding sheet 153, the deposition area S having an irregular shape may be formed.

When the first shielding sheet 153 and the second shielding sheet 154 are located as described above, at least a portion of the first protrusion 153-2 may overlap with at least a portion of the second protrusion 154-2. In this case, a part of the second protrusion 154-2 may protrude to the outside of the first protrusion 153-2. Accordingly, the second protrusion 154-2 may form a boundary of the second deposition area S2 different from a boundary of the first deposition area S1 formed by the first protrusion 153-2 in the first deposition area S1.

In an embodiment, the first shielding sheet 153 and the second shielding sheet 154 may be located on the mask frame 151, and then the mask sheet 152 may be located as described above. In this case, the first shielding sheet 153 and the second shielding sheet 154 may be sequentially stacked on the mask frame 151, or the second shielding sheet 154 and the first shielding sheet 153 may be sequentially stacked on the mask frame 151. For convenience of explanation, the following will be described in further detail on the assumption that the mask frame 151, the second shielding sheet 154, and the first shielding sheet 153 are sequentially stacked.

The mask sheet 152 may be located in the same direction as one of the first shielding sheet 153 and the second shielding sheet 154. For convenience of explanation, the following will be described in further detail on the assumption that the mask sheet 152 is located in the same direction as the second shielding sheet 154.

The mask sheet 152 that is stretched may be located on the mask frame 151 and may be fixed to the mask frame 151.

Accordingly, since deformation of the first shielding sheet 153 when the mask assembly 150 is manufactured is minimized or reduced, the deposition area S that is the same as or similar to a pre-designed deposition area may be formed.

Figure 5:
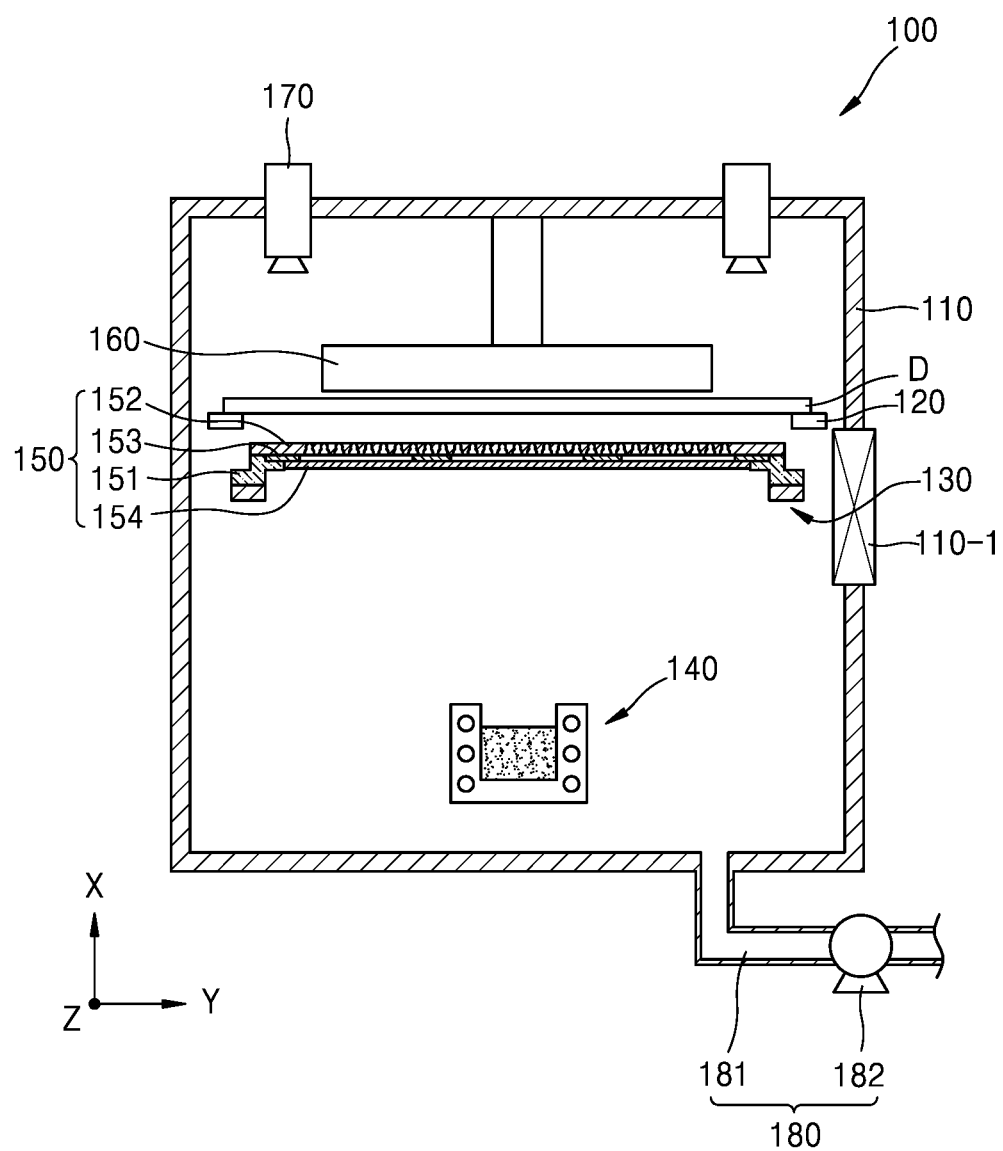
FIG. 5 is a cross-sectional view of an apparatus for manufacturing a display apparatus using the mask assembly of FIG. 1.

FIG. 5 is a cross-sectional view of an apparatus for manufacturing a display apparatus using the mask assembly 150 of FIG. 1.

Referring to FIG. 5, according to an embodiment, an apparatus 100 for manufacturing a display apparatus may include a chamber 110, a first support portion 120, a second support portion 130, the mask assembly 150, a source unit 140, a magnetic unit 160, a vision unit 170, and a pressure adjusting unit 180.

An inner space may be formed in the chamber 110, and the chamber 110 may have an open portion. In this case, a gate valve 110-1 may be provided at the open portion of the chamber 110. In this case, the open portion of the chamber 110 may be opened or closed according to an operation of the gate valve 110-1.

The first support portion 120 may allow a display substrate D to be mounted thereon and may support the display substrate D. In an embodiment, the first support portion 120 may have a plate shape fixed to the inside of the chamber 110. In another embodiment, the first support portion 120 may allow the display substrate D to be mounted thereon and may linearly shuttle in the chamber 110. In another embodiment, the first support portion 120 may include an electrostatic chuck or an adhesive chuck that is fixed to the chamber 110 or is elevatable. For convenience of explanation, the following will be described in further detail on the assumption that the first support portion 120 has a plate shape fixed to the inside of the chamber 110.

The mask assembly 150 may be mounted on the second support portion 130. In this case, the second support portion 130 may be located in the chamber 110. The second support portion 130 may finely adjust a position of the mask assembly 150. In this case, the second support portion 130 may include an additional driver or an alignment unit to move the mask assembly 150 in different directions.

The source unit 140 may face the mask assembly 150. In this case, a deposition material may be received in the source unit 140, and the deposition material may be evaporated or sublimated by applying heat to the deposition material. The source unit 140 may be fixed to the inside of the chamber 110, or may be located in the chamber 110 to be linearly movable in a direction. For convenience of explanation, the following will be described in further detail on the assumption that the source unit 140 is fixed to the inside of the chamber 110.

The magnetic unit 160 may be located in the chamber 110 to face the display substrate D. In this case, the magnetic unit 160 may apply a magnetic force to the mask sheet 152 such that the mask assembly 150 is forced toward the display substrate D. In particular, the magnetic unit 160 may prevent or substantially prevent warpage of the mask sheet 152 and may cause the mask sheet 152 to be adjacent to the display substrate D. Also, the magnetic unit 160 may uniformly maintain an interval between the mask sheet 152 and the display substrate D in a longitudinal direction of the mask sheet 152.

The vision unit 170 may be located on the chamber 110 and may obtain images of positions of the display substrate D and the mask assembly 150. In an embodiment, the vision unit 170 may include a camera for obtaining images of the display substrate D and the mask assembly 150. The positions of the display substrate D and the mask assembly 150 may be determined based on the images obtained by the vision unit 170, and the second support portion 130 may finely adjust the position of the mask assembly 150 based on the images.

The pressure adjusting unit 180 may be connected to the chamber 110 and may adjust an internal pressure of the chamber 110. For example, the pressure adjusting unit 180 may adjust an internal pressure of the chamber 110 to be equal or similar to an atmospheric pressure. Also, the pressure adjusting unit 180 may adjust an internal pressure to the chamber 110 to be equal or similar to a vacuum.

The pressure adjusting unit 180 may include a connection pipe 181 connected to the chamber 110 and a pump 182 provided on the connection pipe 181. In this case, external air may be introduced through the connection pipe 181 or gas in the chamber 110 may be guided to the outside through the connection pipe 181 according to an operation of the pump 182.

The apparatus 100 may be used to manufacture a display apparatus described below. In further detail, when the pressure adjusting unit 180 adjusts an internal pressure of the chamber 110 to be equal or similar to an atmospheric pressure, the gate valve 110-1 may operate to open the open portion of the chamber 110.

Next, the display substrate D may be introduced from the outside of the chamber 110 into the chamber 110. In this case, the display substrate D may be introduced into the chamber 110 in any of various ways. For example, the display substrate D may be introduced from the outside of the chamber 110 into the chamber 110 via a robot arm located outside the chamber 110. In another embodiment, when the first support portion 120 is formed to be shuttlable, the first support portion 120 may be taken out of the chamber 110, the display substrate D may be mounted on the first support portion 120 through an additional robot arm located outside the chamber 110, and the first support portion 120 may be introduced into the chamber 110 from the outside of the chamber 110. For convenience of explanation, the following will be described in further detail on the assumption that the display substrate D is introduced from the outside of the chamber 110 into the chamber 110 through the robot arm located outside the chamber 110.

The mask assembly 150 may be located in the chamber 110. In another embodiment, the mask assembly 150 may be introduced from the outside of the chamber 110 into the chamber 110, like the display substrate D. However, for convenience of explanation, the following will be described in further detail on the assumption that in a state in which the mask assembly 150 is located in the chamber 110, only the display substrate D is introduced from the outside of the chamber 110 into the chamber 110.

Once the display substrate D is introduced into the chamber 110, the display substrate D may be mounted on the first support portion 120. In this case, the vision unit 170 may obtain images of positions of the display substrate D and the mask assembly 150. In an embodiment, the vision unit 170 may obtain images of a first alignment mark of the display substrate D and a second alignment mark of the mask assembly 150.

The positions of the display substrate D and the mask assembly 150 may be determined based on the first alignment mark and the second alignment mark. In this case, the apparatus 100 may include an additional controller (not shown) and may determine the positions of the display substrate D and the mask assembly 150.

When the determining of the positions of the display substrate D and the mask assembly 150 is completed, the second support portion 130 may finely adjust the position of the mask assembly 150.

Next, the source unit 140 may operate to supply a deposition material to the mask assembly 150, and the deposition material passing through the plurality of openings 152-1 may be deposited on the display substrate D. In this case, the pump 182 may absorb gas inside the chamber 110 and may discharge the gas to the outside, thereby maintaining an internal pressure of the chamber 110 at a level equal or similar to a vacuum.

In this case, the deposition material may pass through openings in a deposition area (not shown) and may be deposited on the display substrate D. In this case, the mask assembly 150 may provide the deposition area that is the same as or similar to a designed deposition area, as described above.

Accordingly, the apparatus 100 may deposit the deposition material on an area that is the same as or similar to that designed on the display substrate D. Also, the apparatus 100 may manufacture a precise display apparatus including an emission area having an irregular shape.

Figure 6:
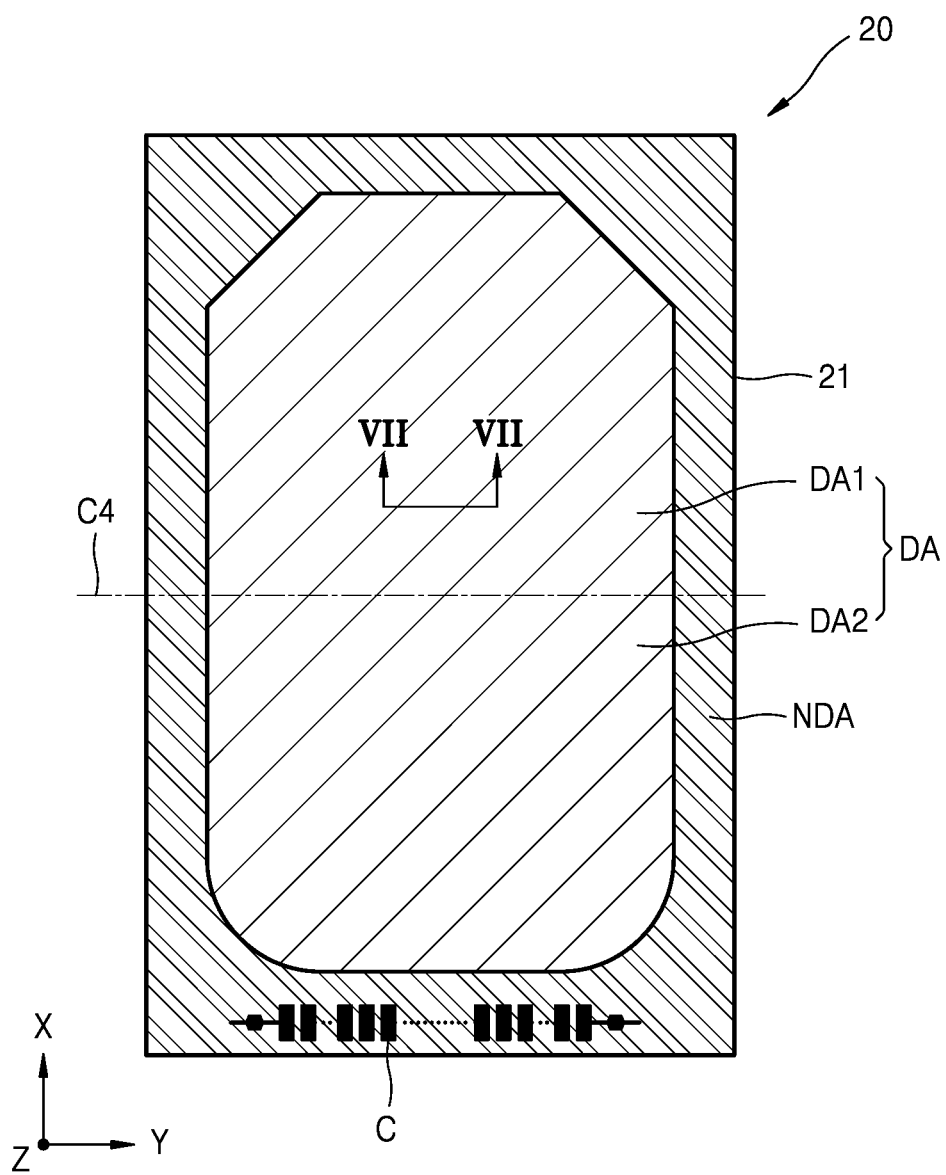
FIG. 6 is a plan view of a display apparatus manufactured by using the apparatus of FIG. 5.
Figure 7:
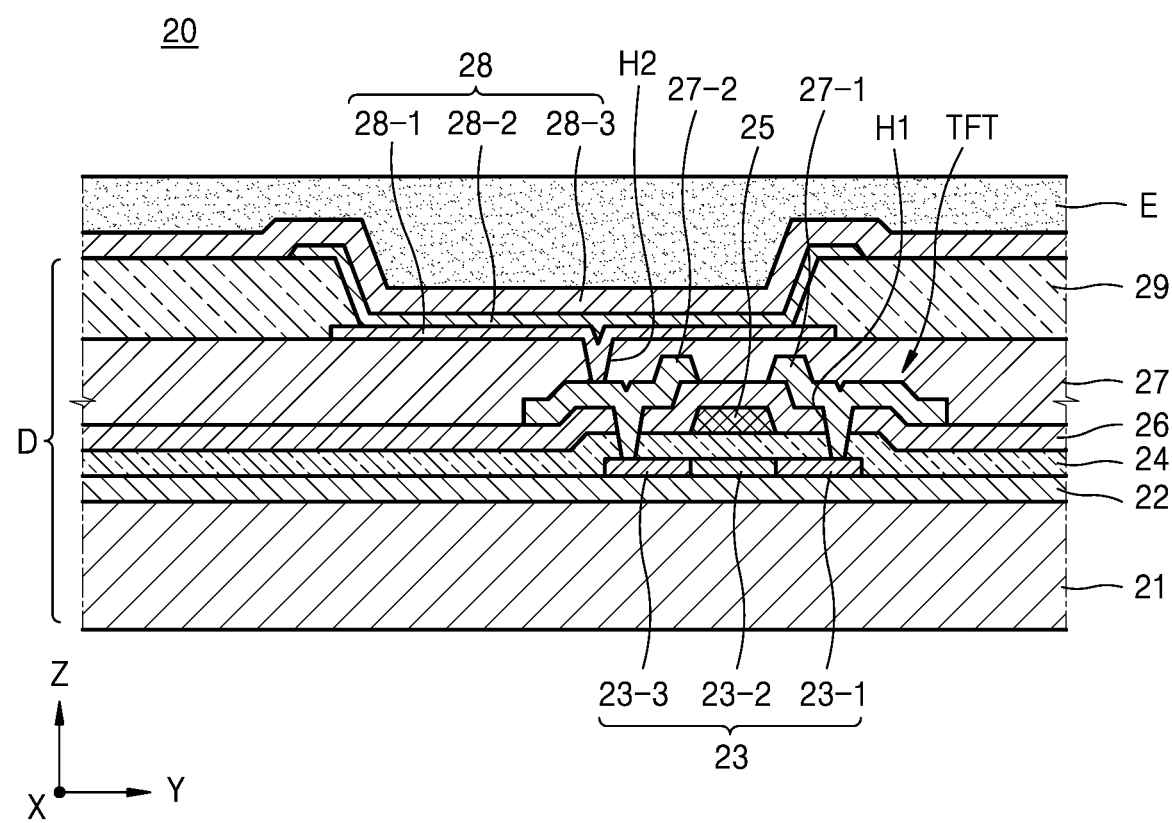
FIG. 7 is a cross-sectional view taken along the line VII-VII of FIG. 6.

FIG. 6 is a plan view illustrating a display apparatus manufactured by the apparatus 100 of FIG. 5; and FIG. 7 is a cross-sectional view taken along the line VII-VII of FIG. 6.

Referring to FIGS. 6 and 7, a display apparatus 20 may include a display area DA defined on a substrate 21 and a non-display area NDA located outside the display area DA. In an embodiment, an organic light-emitting device (OLED) 28 may be located in the display area DA, and a power wiring (not shown) may be located in the non-display area NDA. Also, a pad portion C may be located in the non-display area NDA.

A plurality of deposition material patterns passing through a deposition area (not shown) may be located in the display area DA. In this case, the display area DA may have an irregular shape. In an embodiment, the display area DA may be formed such that both portions of the display area DA are asymmetric to each other about a fourth central line C4 passing through the center of the display area DA. In this case, the center of the display area DA may be a point at which a longest line segment and a shortest line segment from among line segments connecting two random points on a boundary of the display area DA intersect each other. Also, the fourth central line C4 may be parallel to a first central line (not shown) of a first shielding sheet (not shown).

The display area DA may be divided into a first display area DA1 and a second display area DA2 about the fourth central line C4. In this case, shapes and sizes (or areas) of the first display area DA1 and the second display area DA2 may be different from each other.

The display apparatus 20 may include the display substrate D, an intermediate layer 28-2 located on the display substrate D, and a counter electrode 28-3 located on the intermediate layer 28-2. Also, the display apparatus 20 may include a thin-film encapsulation layer E formed on the counter electrode 28-3.

The display substrate D may include the substrate 21, a thin-film transistor (TFT), a passivation film 27, and a pixel electrode 28-1.

The substrate 21 may be formed of a plastic material, or may be formed of a metal material, such as stainless steel (SUS) or titanium (Ti). Also, the substrate 21 may be formed of polyimide (PI). For convenience of explanation, the following will be described in further detail on the assumption that the substrate 21 is formed of PI.

The TFT may be formed on the substrate 21, the passivation film 27 may be formed to cover the TFT, and the OLED 28 may be formed on the passivation film 27.

A buffer layer 22 formed of an organic compound and/or an inorganic compound may be further formed on a top surface of the substrate 21 by using SiOx (x≥1) or SiNx (x≥1).

In an embodiment, after an active layer 23 having a predetermined pattern is formed on the buffer layer 22, the active layer 23 is covered by a gate insulating layer 24. The active layer 23 includes a source region 23-1 and a drain region 23-3, and further includes a channel region 23-2 located between the source region 23-1 and the drain region 23-3.

The active layer 23 may include any of various materials. For example, the active layer 23 may include an inorganic semiconductor material, such as amorphous silicon or crystalline silicon. Alternatively, the active layer 23 may include an oxide semiconductor. Alternatively, the active layer 23 may include an organic semiconductor material. However, for convenience of explanation, the following will be described in further detail on the assumption that the active layer 23 is formed of amorphous silicon.

In an embodiment, the active layer 23 may be formed by forming an amorphous silicon film on the buffer layer 22, crystallizing the amorphous silicon film into a polycrystalline silicon film, and patterning the polycrystalline silicon film. The source region 23-1 and the drain region 23-3 of the active layer 23 are doped with impurities according to a type of the TFT, such as a driving TFT (not shown) or a switching TFT (not shown).

A gate electrode 25 corresponding to the active layer 23 and an interlayer insulating layer 26 covering the gate electrode 25 are formed on a top surface of the gate insulating layer 24.

After a contact hole H1 is formed in the interlayer insulating layer 26 and the gate insulating layer 24, a source electrode 27-1 and a drain electrode 27-2 are formed on the interlayer insulating layer 26 to respectively contact the source region 23-1 and the drain region 23-3.

The passivation film 27 is formed on the TFT, and the pixel electrode 28-1 of the OLED 28 is formed on the passivation film 27. The pixel electrode 28-1 contacts the drain electrode 27-2 of the TFT through a via hole H2 formed in the passivation film 27. The passivation film 27 may be formed of an inorganic material and/or an organic material and may have a single or multi-layer structure. The passivation film 27 may be formed as a planarization film to have a flat top surface, regardless of a curvature of a lower film, or may be formed to be curved along the curvature of the lower film. In an exemplary embodiment, the passivation film 27 is formed of a transparent insulating material to achieve resonance effect.

After the pixel electrode 28-1 is formed on the passivation film 27, a pixel-defining film 29 made of an organic material and/or an inorganic material is formed to cover the pixel electrode 28-1 and the passivation film 27, and the pixel-defining film 29 has an opening through which the pixel electrode 28-1 is exposed.

The intermediate layer 28-2 and the counter electrode 28-3 are formed on at least the pixel electrode 28-1. In another embodiment, the counter electrode 28-3 may be formed over an entire surface of the display substrate D. In this case, the counter electrode 28-3 may be formed on the intermediate layer 28-2 and the pixel-defining film 29. For convenience of explanation, the following will be described in further detail on the assumption that the counter electrode 28-3 is formed on the intermediate layer 28-2 and the pixel-defining film 29.

In an embodiment, the pixel electrode 28-1 functions as an anode and the counter electrode 28-3 functions as a cathode. However, polarities of the pixel electrode 28-1 and the counter electrode 28-3 may be reversed.

The pixel electrode 28-1 and the counter electrode 28-3 are insulated from each other by the intermediate layer 28-2, and an organic emission layer is made to emit light by applying voltages of different polarities to the intermediate layer 28-2.

The intermediate layer 28-2 may include the organic emission layer. Optionally, the intermediate layer 28-2 may include the organic emission layer, and may further include at least one of a hole injection layer (HIL), a hole transport layer, an electron transport layer, and an electron injection layer. However, the present embodiment is not limited thereto, and the intermediate layer 28-2 may include the organic emission layer and may further include any of other various functional layers (not shown).

In this case, the intermediate layer 28-2 may be formed by the apparatus 100 for manufacturing the display apparatus 20.

A plurality of the intermediate layers 28-2 may be provided, and the plurality of intermediate layers 28-2 may form the display area DA. In particular, the plurality of intermediate layers 28-2 may form the display area DA having a shape other than a rectangular shape and a square shape. In this case, the plurality of intermediate layers 28-2 may be spaced apart from one another in the display are DA.

Areas of some of the plurality of intermediate layers 28-2 may be different from areas of others of the plurality of intermediate layers 28-2. For example, areas of some of the plurality of intermediate layers 28-2 may be less than areas of others of the plurality of intermediate layers 28-2. The intermediate layers 28-2 whose areas are less than areas of other intermediate layers 28-2 from among the plurality of intermediate layers 28-2 may be formed at a boundary of a shielding portion (not shown).

One unit pixel may include a plurality of sub-pixels, and the plurality of sub-pixels may emit light of various colors. For example, the plurality of sub-pixels may include sub-pixels that emit red light, green light, and blue light, or may include sub-pixels (not shown) that emit red light, green light, blue light, and white light.

The sub-pixel may include one intermediate layer 28-2. In this case, when one sub-pixel is formed, the intermediate layer 28-2 may be formed by the apparatus 100.

The thin-film encapsulation layer E may include a plurality of inorganic layers, or an inorganic layer and an organic layer.

The organic layer of the thin-film encapsulation layer E may be formed of a polymer, and, in an exemplary embodiment, may have a single or multi-layer structure formed of any one of polyethylene terephthalate, polyimide, polycarbonate, epoxy, polyethylene, and polyacrylate. In an exemplary embodiment, the organic layer of the thin-film encapsulation layer E may be formed of polyacrylate. In further detail, the organic layer may include a polymerized monomer composition including a diacrylate-based monomer and a triacrylate-based monomer. A monoacrylate-based monomer may be further included in the monomer composition. Also, a well-known photoinitiator, such as TPO, may be further included in the monomer composition, but the present embodiment is not limited thereto.

The inorganic layer of the thin-film encapsulation layer E may have a single or multi-layer structure including a metal oxide or a metal nitride. In an embodiment, the inorganic layer of the thin-film encapsulation layer E may include any one of SiNx, $Al_2O_3$, $SiO_2$, and $TiO_2$.

In an embodiment, an uppermost layer exposed to the outside in the thin-film encapsulation layer E may be an inorganic layer to prevent or substantially prevent penetration of moisture to the OLED 28.

The thin-film encapsulation layer E may include at least one sandwich structure in which at least one organic layer is inserted between at least two inorganic layers. Alternatively, the thin-film encapsulation layer E may include at least one sandwich structure in which at least one inorganic layer is inserted between at least two organic layers. Alternatively, the thin-film encapsulation layer E may include a sandwich structure in which at least one organic layer is inserted between at least two inorganic layers and a sandwich structure in which at least one inorganic layer is inserted between at least two organic layers.

In an embodiment, the thin-film encapsulation layer E may include a first inorganic layer, a first organic layer, and a second inorganic layer sequentially formed on the OLED 28.

Alternatively, the thin-film encapsulation layer E may include a first inorganic layer, a first organic layer, a second inorganic layer, a second organic layer, and a third inorganic layer sequentially formed on the OLED 28.

Alternatively, the thin-film encapsulation layer E may include a first inorganic layer, a first organic layer, a second inorganic layer, a second organic layer, a third inorganic layer, a third organic layer, and a fourth inorganic layer sequentially formed on the OLED 28.

In an embodiment, a halogenated metal layer including LiF may be further included between the OLED 28 and the first inorganic layer. The halogenized metal layer may prevent or substantially prevent damage to the OLED 28 when the first inorganic layer is formed by using sputtering.

The first organic layer may be formed to have an area less than that of the second inorganic layer. The second organic layer may be formed to have an area less than that of the third inorganic layer.

Accordingly, the display apparatus 20 may have the display area DA having a shape other than a rectangular shape and a square shape. Also, the display apparatus 20 may have the display area DA that is the same as or similar to a designed display area.

Figure 8:
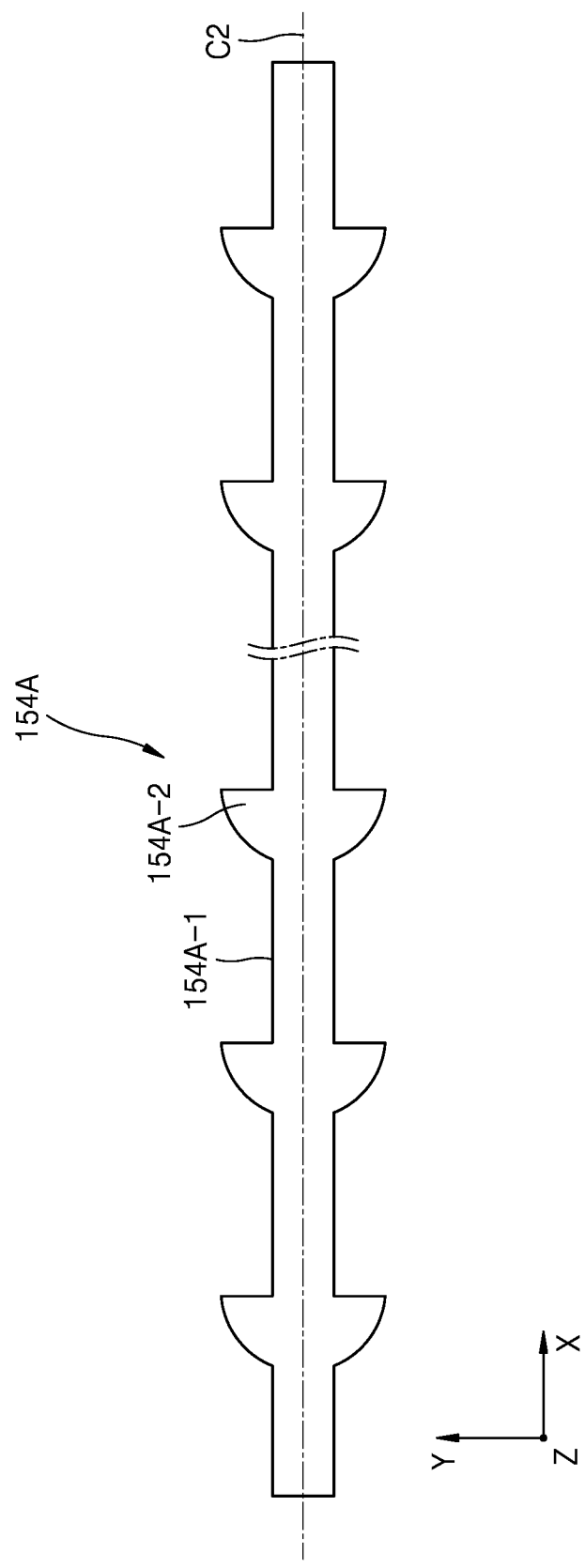
FIG. 8 is a plan view illustrating a second shielding sheet of a mask assembly according to another embodiment.
Figure 9:
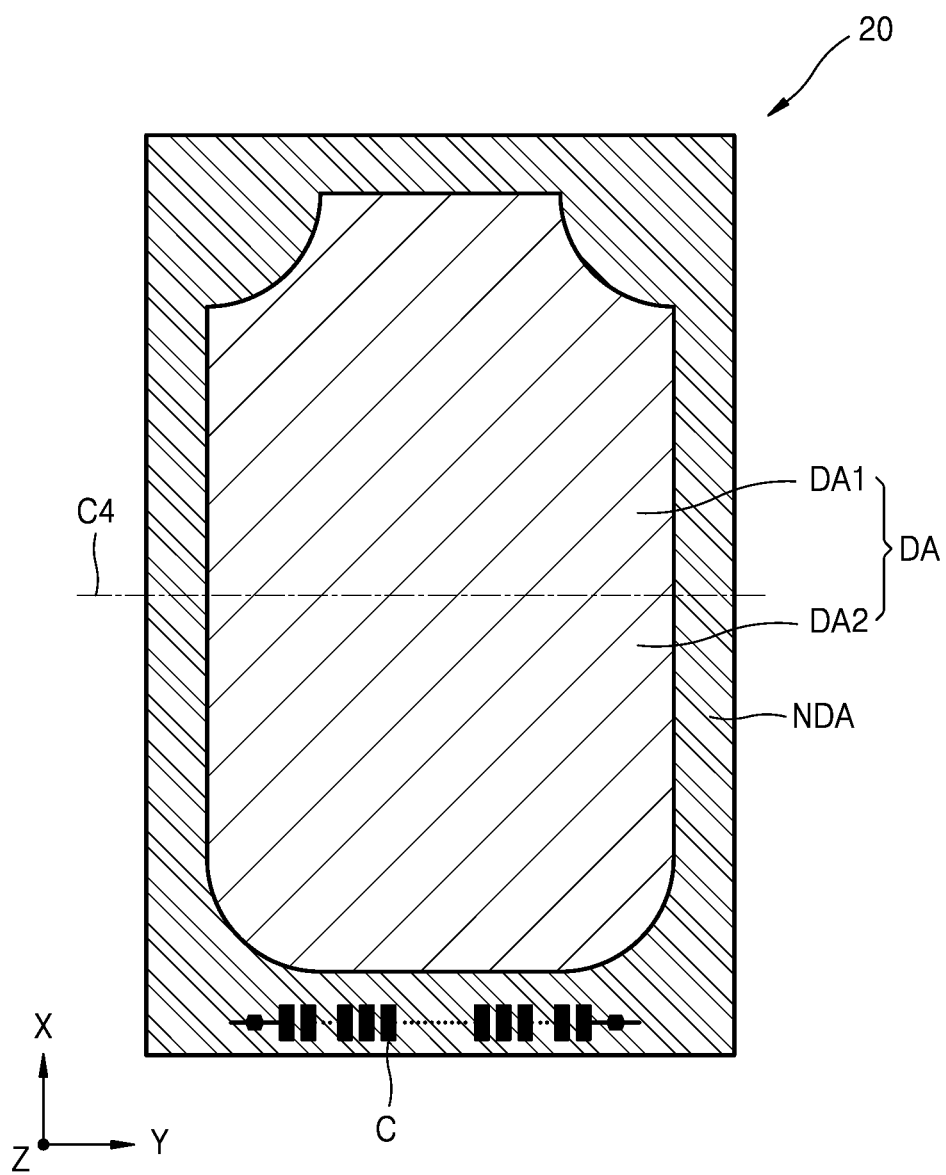
FIG. 9 is a plan view of a display apparatus manufactured by using the mask assembly including the second shielding sheet of FIG. 8.

FIG. 8 is a plan view illustrating a second shielding sheet of a mask assembly according to another embodiment; and FIG. 9 is a plan view illustrating a display apparatus manufactured by using the mask assembly including the second shielding sheet of FIG. 8.

Referring to FIGS. 8 and 9, a mask assembly (not shown) may include a mask frame (not shown), a first shielding sheet (not shown), a second shielding sheet 154A, and a mask sheet (not shown). In this case, the mask frame, the first shielding sheet, and the mask sheet may be the same as or similar to those described with respect to FIGS. 1 through 4, and, thus, repeated explanation thereof will not be given.

The second shielding sheet 154A may include a second shielding sheet body portion 154A-1 and a second protrusion 154A-2. In this case, the second shielding sheet body portion 154A-1 and the second protrusion 154A-2 may be similar to that of FIGS. 1 through 4, and a shape of the second protrusion 154A-2 may be different from that of FIGS. 1 through 4. In this case, the second protrusion 154A-2 may have a shape similar to a part of a circular shape. In this case, the second protrusion 154A-2 may be formed to be opposite to a first protrusion (not shown) and may shield a part of the first protrusion.

In this case, both portions of the first shielding sheet may be symmetric about a first central line (not shown), and both portions of the second shielding sheet 154A may be symmetric about the second central line C2. As described above, when the first shielding sheet and the second shielding sheet 154A are stretched and are fixed to the mask frame, at least one of the first shielding sheet and the second shielding sheet 154A may not be distorted.

Accordingly, the mask assembly may pass a deposition material therethrough to a designed deposition area.

When the deposition material is deposited on a display substrate (not shown) by using the mask assembly, the display area DA of FIG. 9 may be provided. In this case, the display apparatus 20 may be formed in the same manner as in FIG. 7. In this case, the non-display area NDA may be located around the display area DA, and the pad portion C may be located in the non-display area NDA.

The display area DA may be divided into the first display area DA1 and the second display area DA2 about the fourth central line C4. In this case, the first display area DA1 and the second display area DA2 may have different shapes and different sizes as shown in FIG. 9. In this case, a corner of the first display area DA1 may be curved inward to be round. In contrast, a corner of the second display area DA2 may be curved outward to be round. In this case, at least one of the corner of the first display area DA1 and the corner of the second display area DA2 may have at least one radius of curvature. In an embodiment, when the corner of the first display area DA1 has one radius of curvature and the corner of the second display area DA2 has one radius of curvature, the radius of curvature of the corner of the first display area DA1 and the radius of curvature of the corner of the second display area DA2 may be different from each other. In another embodiment, when the corner of the first display area DA1 has a plurality of radii of curvature and the corner of the second display area DA2 has a plurality of radii of curvature, at least one of the radii of curvature of the corner of the first display area DA1 and at least one of the radii of curvature of the corner of the second display area DA2 may be different from each other.

Accordingly, the display apparatus 20 may have the display area DA having a fine irregular shape that is the same as or similar to a designed shape.

Figure 10:
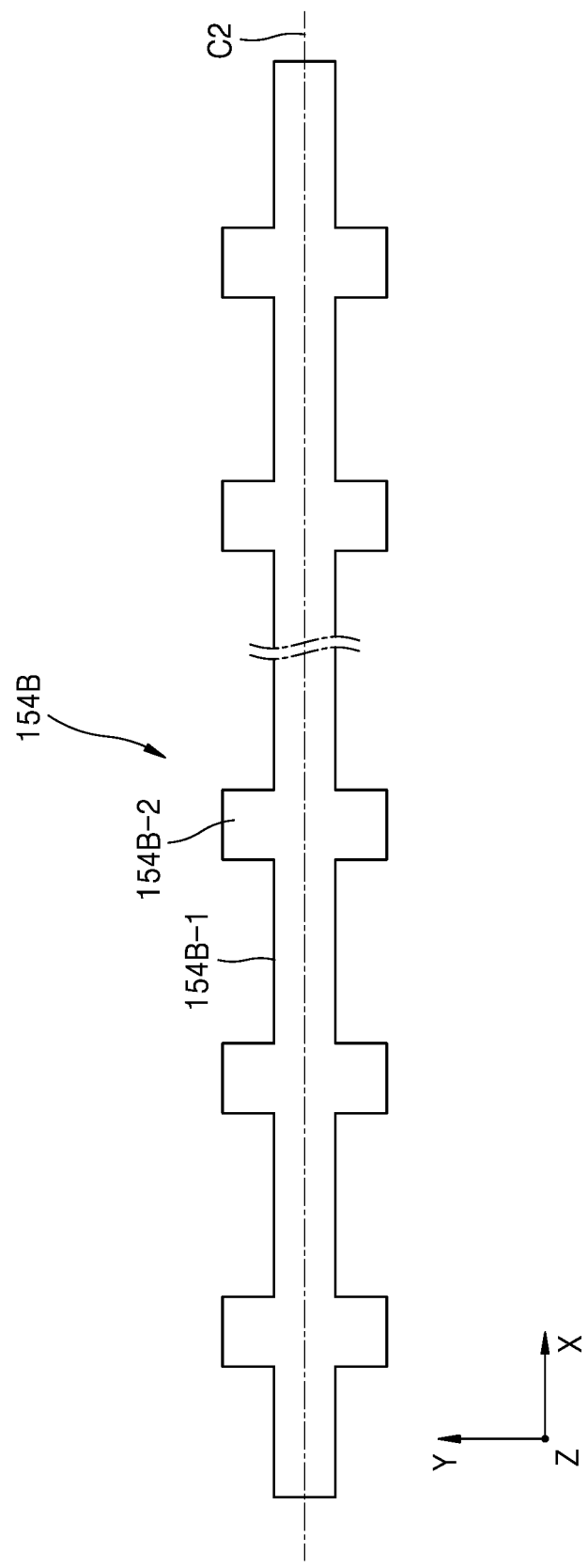
FIG. 10 is a plan view illustrating a second shielding sheet of a mask assembly according to another embodiment.
Figure 11:
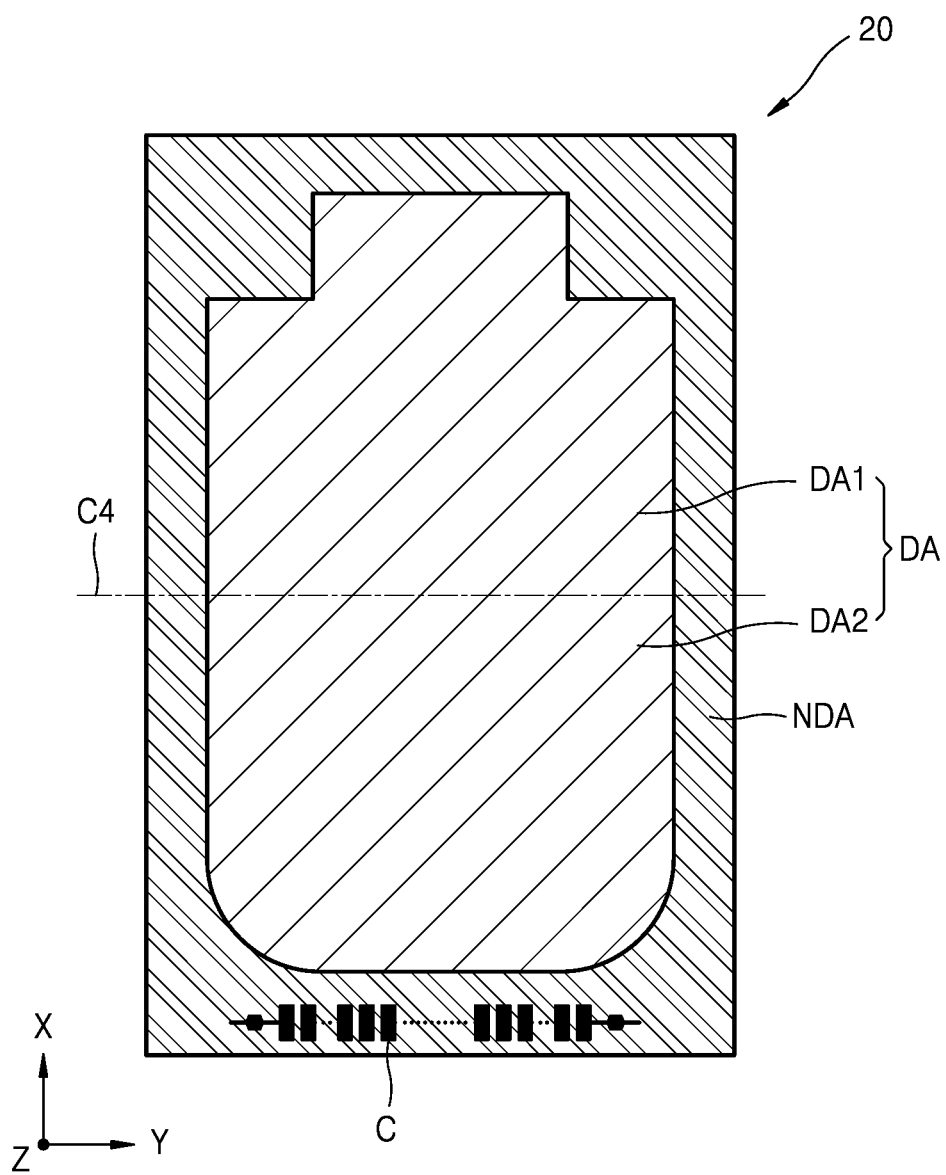
FIG. 11 is a plan view of a display apparatus manufactured by using the mask assembly including the second shielding sheet of FIG. 10.

FIG. 10 is a plan view illustrating a second shielding sheet of a mask assembly according to another embodiment; and FIG. 11 is a plan view illustrating a display apparatus manufactured by using the mask assembly including the second shielding sheet of FIG. 10.

Referring to FIGS. 10 and 11, a mask assembly (not shown) may include a mask frame (not shown), a first shielding sheet (not shown), a second shielding sheet 154B, and a mask sheet (not shown). In this case, the mask frame, the first shielding sheet, and the mask sheet may be the same as or similar to those described with respect to FIGS. 1 through 4, and, thus, repeated explanation thereof will not be given.

The second shielding sheet 154B may include a second shielding sheet body portion 154B-1 and a second protrusion 154B-2. In this case, the second shielding sheet body portion 154B-1 may be similar to that of FIGS. 1 through 4, and a shape of the second protrusion 154B-2 may be different from that of FIGS. 1 through 4. In this case, the second protrusion 154B-2 may have a quadrangular shape. In this case, the second protrusion 154B-2 may shield a part of a first protrusion.

In this case, both portions of the first shielding sheet may be symmetric about a first central line (not shown), and both portions of the second shielding sheet 154B may be symmetric about the second central line C2. In this case, when the first shielding sheet and the second shielding sheet 154B are stretched and fixed to the mask frame (not shown) as described above, at least one of the first shielding sheet and the second shielding sheet 154B may not be distorted.

Accordingly, the mask assembly may pass a deposition material therethrough to a designed deposition area.

When the deposition material is deposited on a display substrate (not shown) by using the mask assembly, the display area DA of FIG. 11 may be provided. In this case, the display apparatus 20 may be formed in the same manner as in FIG. 7. In this case, the non-display area NDA may be located around the display area DA, and the pad portion C may be located in the non-display area NDA.

The display area DA may include the first display area DA1 and the second display area DA2 about the fourth central line C4. In this case, the first display area DA1 and the second display area DA2 may have different shapes and different sizes as shown in FIG. 11. For example, a corner portion of the first display area DA1 may be stepped, and a corner portion of the second display area DA2 may be round.

Accordingly, the display apparatus 20 may have the display area DA having a fine irregular shape that is the same as or similar to a designed shape.

Figure 12:
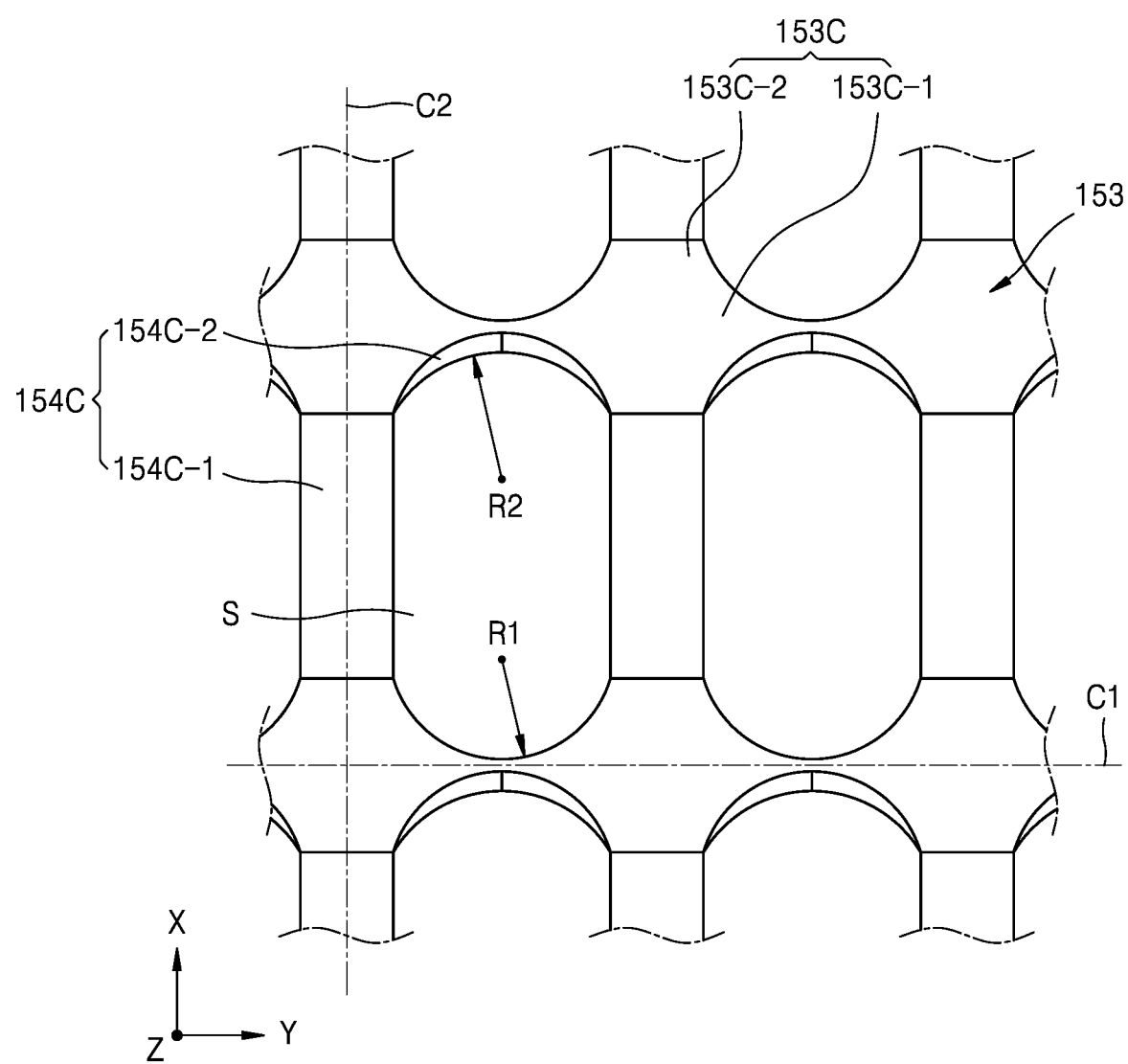
FIG. 12 is a plan view illustrating a first shielding sheet and a second shielding sheet of a mask assembly according to another embodiment.
Figure 13:
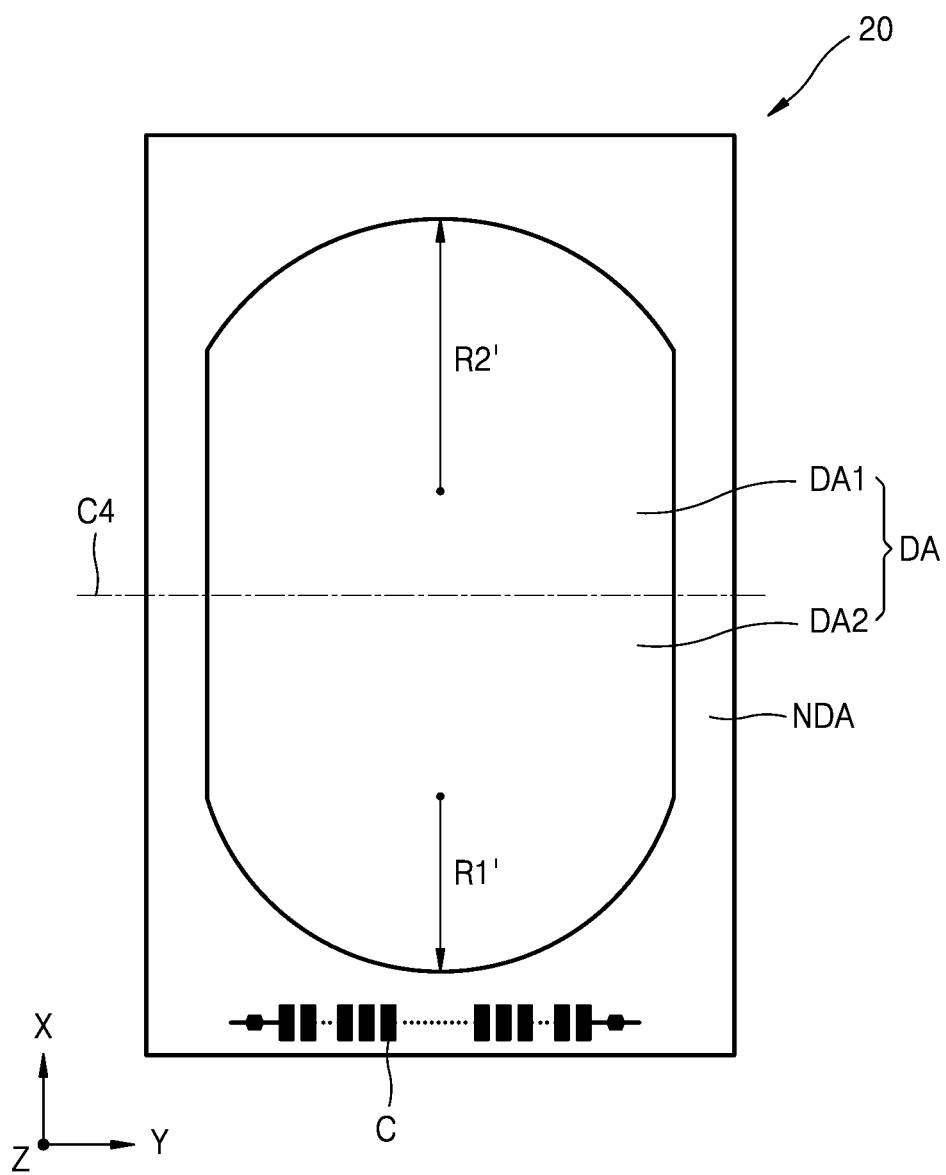
FIG. 13 is a plan view of a display apparatus manufactured by using the mask assembly including the first and second shielding sheets of FIG. 12.

FIG. 12 is a plan view illustrating a first shielding sheet and a second shielding sheet of a mask assembly according to another embodiment; and FIG. 13 is a plan view illustrating a display apparatus manufactured by using the mask assembly including the first and second shielding sheets of FIG. 12.

Referring to FIGS. 12 and 13, a mask assembly (not shown) may include a mask frame (not shown), a first shielding sheet 153C, a second shielding sheet 154C, and a mask sheet (not shown). In this case, the mask frame and the mask sheet may be the same as or similar to those described with respect to FIGS. 1 through 4, and, thus, repeated explanation thereof will not be given.

The first shielding sheet 153C may include a first shielding sheet body portion 153C-1 and a first protrusion 153C-2. In this case, the first shielding sheet body portion 153C-1 and the first protrusion 153C-2 are the same as or similar to those of FIGS. 1 through 4, and, thus, a detailed explanation thereof will not be given.

The second shielding sheet 154C may include a second shielding sheet body portion 154C-1 and a second protrusion 154C-2. In this case, the second shielding sheet body portion 154C-1 and the second protrusion 154C-2 may be similar to those of FIGS. 1 through 4. In this case, since the second protrusion 154C-2 is formed to be opposite to the first protrusion 153C-2, the second protrusion 154C-2 may shield a part of the first protrusion 153C-2. In this case, shapes of a round portion of the first protrusion 153C-2 and a round portion of the second protrusion 154C-2 may be different from each other. For example, a radius of curvature R1 of the round portion of the first protrusion 153C-2 and a radius of curvature R2 of the round portion of the second protrusion 154C-2 may be different from each other.

In this case, both portions of the first shielding sheet 153C may be symmetric about the first central line C1, and both portions of the second shielding sheet 154C may be symmetric about the second central line C2. In this case, as described above, when the first shielding sheet 153C and the second shielding sheet 154C are stretched and are fixed to the mask frame, at least one of the first shielding sheet 153C and the second shielding sheet 154C may not be distorted.

Accordingly, the mask assembly may pass a deposition material therethrough to a designed deposition area.

When the deposition material is deposited on a display substrate (not shown) by using the mask assembly, the display area DA of FIG. 13 may be provided. In this case, the display apparatus 20 may be formed in the same manner as in FIG. 7. In this case, the non-display area NDA may be located around the display area DA, and the pad portion C may be located in the non-display area NDA, The display area DA may be divided into the first display area DA1 and the second display area DA2 about the fourth central line C4. In this case, the first display area DA1 and the second display area DA2 may have different shapes and different sizes as shown in FIG. 13. In this case, a corner of the first display area DA1 and a corner of the second display area DA2 may protrude to the outside of the display area DA. In this case, at least one of the first display area DA1 and the second display area DA2 may have at least one radius of curvature. In an embodiment, when the first display area DA1 has one radius of curvature R1' and the second display area DA2 has one radius of curvature R2', the radius of curvature R1' of the first display area DA1 and the radius of curvature R2' of the second display area DA2 may be different from each other. In another embodiment, when the first display area DA1 has a plurality of radii of curvature R1' and the second display area DA2 has a plurality of radii of curvature R2', at least one of the radii of curvature R1' of the first display area DA1 and at least one of the radii of curvature R2' of the second display area DA2 may be different from each other. In particular, the first display area DA1 may be formed when the deposition material is shielded by the first protrusion 153C-2. Also, the second display area DA2 may be formed when the deposition material is shielded by the second protrusion 154C-2. That is, the first protrusion 153C-2 may affect the formation of the first display area DA1, and the second protrusion 154C-2 may affect the formation of the second display area DA2.

Accordingly, the display apparatus 20 may have the display area DA having a fine irregular shape that is the same as or similar to a designed shape.

A mask assembly according to one or more embodiments of the present disclosure may maintain a shape that is the same as or similar to an initially designed shape.

An apparatus and method for manufacturing a display apparatus according to one or more embodiments of the present disclosure may manufacture a display apparatus having a display area having an irregular shape that is the same as or similar to a designed shape.

The apparatus and method for manufacturing the display apparatus according to one or more embodiments of the present disclosure may manufacture the display apparatus in which an outermost portion of the display area is not distorted.

While one or more embodiments have been described with reference to the figures, it will be understood by one of ordinary skill in the art that various changes in form and details may be made therein without departing from the spirit and scope as set forth by the following claims.

What is claimed is:

1. A mask assembly comprising:
   a mask frame;
   a mask sheet on the mask frame and comprising a plurality of openings;
   at least two first shielding sheets between the mask frame and the mask sheet and shielding some of the plurality of openings of the mask sheet, the at least two first shielding sheets being spaced apart from one another in a first direction; and
   at least two second shielding sheets between the mask frame and the mask sheet and shielding some of the plurality of openings of the mask sheet, the at least two second shielding sheets each having an angle with respect to each of the at least two first shielding sheets, the at least two second shielding sheets being spaced apart from one another in a second direction crossing the first direction,
   wherein the at least two first shielding sheets and the at least two second shielding sheets define a deposition area comprising some of the plurality of openings of the mask sheet by shielding some of the plurality of openings of the mask sheet,
   wherein the deposition area is divided into a first deposition area and a second deposition area by an arbitrary straight line passing through the center of a space formed by two adjacent first shielding sheets of the at least two first shielding sheets and parallel to a longitudinal direction of a first shielding sheet of the at least two first shielding sheets, and shapes of the first deposition area and the second deposition area are different from each other, wherein the first deposition area and the second deposition area are defined by portions of outer perimeters of the two adjacent first shielding sheets and portions of outer perimeters of two adjacent second shielding sheets of the at least two second shielding sheets, and the outer perimeters of the two adjacent first shielding sheets have a shape different from that of the outer perimeters of the two adjacent second shielding sheets.

2. The mask assembly of claim 1, wherein the first shielding sheet comprises:
   a first shielding sheet body portion; and
   a first protrusion protruding from the first shielding sheet body portion to have an angle in a longitudinal direction of the first shielding sheet body portion.

3. The mask assembly of claim 2, wherein the first protrusion comprises a plurality of first protrusions,
wherein two first protrusions from among the plurality of first protrusions face each other about the first shielding sheet body portion.

4. The mask assembly of claim 3, wherein the two first protrusions facing each other about the first shielding sheet body portion have a same shape.

5. The mask assembly of claim 1, wherein portions of at least one of the first shielding sheet and a second shielding sheet of the at least two second shielding sheets are symmetric about a virtual central line parallel to the longitudinal direction.

6. The mask assembly of claim 1, wherein the first shielding sheet and a second shielding sheet of the at least two second shielding sheets are perpendicular to each other.

7. The mask assembly of claim 1, wherein a second shielding sheet of the at least two second shielding sheets comprises:
a second shielding sheet body portion; and
a second protrusion protruding from the second shielding sheet body portion.

8. The mask assembly of claim 7, wherein the second protrusion comprises a plurality of second protrusions,
wherein two second protrusions from among the plurality of second protrusions face each other about the second shielding sheet body portion.

9. The mask assembly of claim 7, wherein the first shielding sheet comprises:
a first shielding sheet body portion; and
a first protrusion protruding from the first shielding sheet body portion to have an angle in a longitudinal direction of the first shielding sheet body portion.

10. The mask assembly of claim 9, wherein at least portions of the first protrusion and the second protrusion overlap with each other.

11. The mask assembly of claim 9, wherein the first protrusion and the second protrusion have different shapes.

12. The mask assembly of claim 9, wherein the first protrusion and the second protrusion have different areas.

13. An apparatus for manufacturing a display apparatus, the apparatus comprising:
a deposition source;
a mask assembly facing the deposition source to allow a deposition material ejected from the deposition source to pass therethrough; and
a substrate support portion facing the mask assembly and supporting a substrate on which the deposition material passing through the mask assembly is deposited,
wherein the mask assembly comprises:
a mask frame;
a mask sheet on the mask frame and comprising a plurality of openings;
at least two first shielding sheets between the mask frame and the mask sheet and shielding some of the plurality of openings of the mask sheet, the at least two first shielding sheets being spaced apart from one another in a first direction; and
at least two second shielding sheets between the mask frame and the mask sheet and shielding some of the plurality of openings of the mask sheet, the at least two second shielding sheets each formed to have an angle with respect to each of the at least two first shielding sheets, the at least two second shielding sheets being spaced apart from one another in a second direction crossing the first direction,
wherein the at least two first shielding sheets and the at least two second shielding sheets define a deposition area comprising some of the plurality of openings of the mask sheet by shielding some of the plurality of openings of the mask sheet,
wherein the deposition area is divided into a first deposition area and a second deposition area by an arbitrary straight line passing through the center of a space formed by two adjacent first shielding sheets of the at least two first shielding sheets and parallel to a longitudinal direction of a first shielding sheet of the at least two first shielding sheets, and shapes of the first deposition area and the second deposition area are different from each other, wherein the first deposition area and the second deposition area are defined by portions of outer perimeters of the two adjacent first shielding sheets and portions of outer perimeters of two adjacent second shielding sheets of the at least two second shielding sheets, and the outer perimeters of the two adjacent first shielding sheets have a shape different from that of the outer perimeters of the two adjacent second shielding sheets.

14. The apparatus of claim 13, wherein the first shielding sheet comprises:
a first shielding sheet body portion; and
a first protrusion protruding from the first shielding sheet body portion to have an angle in a longitudinal direction of the first shielding sheet body portion.

15. The apparatus of claim 14, wherein the first protrusion comprises a plurality of first protrusions,
wherein two first protrusions from among the plurality of first protrusions face each other about the first shielding sheet body portion.

16. The apparatus of claim 15, wherein the two first protrusions facing each other about the first shielding sheet body portion have a same shape.

17. The apparatus of claim 13, wherein portions of at least one of the first shielding sheet and a second shielding sheet of the at least two second shielding sheets are symmetric about a virtual central line parallel to the longitudinal direction.

18. The apparatus of claim 13, wherein the first shielding sheet and a second shielding sheet of the at least two second shielding sheets are perpendicular to each other.

19. The apparatus of claim 13, wherein a second shielding sheet of the at least two second shielding sheets comprises:
a second shielding sheet body portion; and
a second protrusion protruding from the second shielding sheet body portion.

20. The apparatus of claim 19, wherein the second protrusion comprises a plurality of second protrusions,
wherein two second protrusions from among the plurality of second protrusions face each other about the second shielding sheet body portion.

21. The apparatus of claim 19, wherein the first shielding sheet comprises:
a first shielding sheet body portion; and
a first protrusion protruding from the first shielding sheet body portion to have an angle in a longitudinal direction of the first shielding sheet body portion.

22. The apparatus of claim 21, wherein at least portions of the first protrusion and the second protrusion overlap with each other.

23. The apparatus of claim 21, wherein the first protrusion and the second protrusion have different shapes.

24. The apparatus of claim 21, wherein the first protrusion and the second protrusion have different areas.

25. A method of manufacturing a display apparatus, the method comprising:
arranging a display substrate and a mask assembly in a chamber;
aligning the display substrate with the mask assembly; and
forming a deposition material pattern on the display substrate by supplying a deposition material from a deposition source facing the mask assembly,
wherein the mask assembly comprises:
a mask frame;
a mask sheet on the mask frame and comprising a plurality of openings;
at least two first shielding sheets between the mask frame and the mask sheet and shielding some of the plurality of openings of the mask sheet, the at least two first shielding sheets being spaced apart from one another in a first direction; and
at least two second shielding sheets between the mask frame and the mask sheet and shielding some of the plurality of openings of the mask sheet, the at least two second shielding sheets each having an angle with respect to each of the at least two first shielding sheets, the at least two second shielding sheets being spaced apart from one another in a second direction crossing the first direction,
wherein the at least two first shielding sheets and the at least two second shielding sheets define a deposition area comprising some of the plurality of openings of the mask sheet by shielding some of the plurality of openings of the mask sheet,
wherein the deposition area is divided into a first deposition area and a second deposition area by an arbitrary straight line passing through the center of a space formed by two adjacent first shielding sheets of the at least two first shielding sheets and parallel to a longitudinal direction of a first shielding sheet of the at least two first shielding sheets, and shapes of the first deposition area and the second deposition area are different from each other, wherein the first deposition area and the second deposition area are defined by portions of outer perimeters of the two adjacent first shielding sheets and portions of outer perimeters of two adjacent second shielding sheets of the at least two second shielding sheets, and the outer perimeters of the two adjacent first shielding sheets have a shape different from that of the outer perimeters of the two adjacent second shielding sheets.

26. The method of claim 25, wherein the first shielding sheet comprises:
a first shielding sheet body portion; and
a first protrusion protruding from the first shielding sheet body portion to have an angle in a longitudinal direction of the first shielding sheet body portion.

27. The method of claim 26, wherein the first protrusion comprises a plurality of first protrusions,
wherein two first protrusions from among the plurality of first protrusions face each other about the first shielding sheet body portion.

28. The method of claim 27, wherein the two first protrusions facing each other about the first shielding sheet body portion have a same shape.

29. The method of claim 25, wherein portions of at least one of the first shielding sheet and a second shielding sheet of the at least two second shielding sheets are symmetric about a virtual central line parallel to the longitudinal direction.

30. The method of claim 25, wherein the first shielding sheet and a second shielding sheet of the at least two second shielding sheets are perpendicular to each other.

31. The method of claim 25, wherein a second shielding sheet of the at least two second shielding sheets comprises:
a second shielding sheet body portion; and
a second protrusion protruding from the second shielding sheet body portion.

32. The method of claim 31, wherein the second protrusion comprises a plurality of second protrusions,
wherein two second protrusions from among the plurality of second protrusions face each other about the second shielding sheet body portion.

33. The method of claim 31, wherein the first shielding sheet comprises:
a first shielding sheet body portion; and
a first protrusion protruding from the first shielding sheet body portion to have an angle in a longitudinal direction of the first shielding sheet body portion.

34. The method of claim 33, wherein at least portions of the first protrusion and the second protrusion overlap with each other.

35. The method of claim 33, wherein the first protrusion and the second protrusion have different shapes.

36. The method of claim 33, wherein the first protrusion and the second protrusion have different areas.

37. A method of manufacturing a display apparatus, the method comprising:
arranging a display substrate and a mask assembly in a chamber;
aligning the display substrate with the mask assembly; and
forming a deposition material pattern on the display substrate by supplying a deposition material from a deposition source facing the mask assembly,
wherein the mask assembly comprises:
a mask sheet on a mask frame and comprising a plurality of openings;
at least two first shielding sheets between the mask frame and the mask sheet and shielding some of the plurality of openings of the mask sheet, the at least two first shielding sheets being spaced apart from one another in a first direction; and
at least two second shielding sheets between the mask frame and the mask sheet and shielding some of the plurality of openings of the mask sheet, the at least two second shielding sheets each having an angle with respect to each of the at least two first shielding sheets, the at least two second shielding sheets being spaced apart from one another in a second direction crossing the first direction, and
wherein the deposition material pattern formed on the display substrate is used to form a display area, the display area is divided into two areas by an arbitrary straight line passing through the center of the display area and parallel to a longitudinal direction of a first shielding sheet of the at least two first shielding sheets, and the two areas of the display area are asymmetric to each other, wherein the two areas of the display area correspond to portions of outer perimeters of two adjacent first shielding sheets of the at least two first shielding sheets and portions of outer perimeters of two adjacent second shielding sheets of the at least two second shielding sheets, and the outer perimeters of the two adjacent first shielding sheets have a shape different from that of the outer perimeters of the two adjacent second shielding sheets.

38. The method of claim 37, wherein the mask assembly defines a deposition area through which the deposition material passes to be deposited on the display substrate, such that the deposition area corresponds to the display area.

39. The method of claim 38, wherein the at least two first shielding sheets and the at least two second shielding sheets define the deposition area.

40. A method of manufacturing a display apparatus, the method comprising:
- arranging a display substrate and a mask assembly in a chamber;
- aligning the display substrate with the mask assembly; and
- forming a deposition material pattern on the display substrate by supplying a deposition material from a deposition source facing the mask assembly,
- wherein the deposition material pattern formed on the display substrate is used to form a display area, and the display area comprises a first display area formed when a part of the deposition material is shielded by a protrusion of a first shielding sheet of the mask assembly protruding into a deposition area defined by the mask assembly, and a second display area formed when a part of the deposition material is shielded by a protrusion of a second shielding sheet of the mask assembly protruding into the deposition area defined by the mask assembly, a longitudinal direction of the second shielding sheet crossing a longitudinal direction of the first shielding sheet, wherein the first and second display areas correspond to portions of outer perimeters of the first shielding sheet and an adjacent first shielding sheet that is spaced apart from the first shielding sheet in a first direction and portions of outer perimeters of the second shielding sheet and an adjacent second shielding sheet that is spaced apart from the second shielding sheet in a second direction crossing the first direction, and the outer perimeters of the first shielding sheet and the adjacent first shielding sheet have a shape different from that of the outer perimeters of the second shielding sheet and the adjacent second shielding sheet.

* * * * *